(12) United States Patent
Lee et al.

(10) Patent No.: US 8,344,772 B2
(45) Date of Patent: Jan. 1, 2013

(54) TIME-TO-DIGITAL CONVERTER AND ALL DIGITAL PHASE-LOCKED LOOP INCLUDING THE SAME

(75) Inventors: Ja Yol Lee, Daejeon (KR); Seon Ho Han, Daejeon (KR); Mi Jeong Park, Gongju (KR); Jang Hong Choi, Daejeon (KR); Seong Do Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 109 days.

(21) Appl. No.: 12/956,498

(22) Filed: Nov. 30, 2010

(65) Prior Publication Data

US 2011/0148490 A1 Jun. 23, 2011

(30) Foreign Application Priority Data

Dec. 18, 2009 (KR) .................. 10-2009-0127509
Dec. 18, 2009 (KR) .................. 10-2009-0127532
Apr. 26, 2010 (KR) .................. 10-2010-0038681

(51) Int. Cl.
*H03L 7/06* (2006.01)
(52) U.S. Cl. ........ 327/156; 327/150; 327/159; 375/375; 375/376
(58) Field of Classification Search ............ 327/150, 327/156, 159; 375/375, 376
See application file for complete search history.

(56) References Cited

U.S. PATENT DOCUMENTS

| | | | |
|---|---|---|---|
| 2003/0107442 A1 | 6/2003 | Staszewski | |
| 2003/0133522 A1 | 7/2003 | Staszewski et al. | |
| 2003/0141936 A1 | 7/2003 | Staszewski et al. | |
| 2007/0110194 A1* | 5/2007 | de Obaldia et al. | ........... 375/345 |

OTHER PUBLICATIONS

Robert Bogdan Staszewski et al., "All-Digital PLL With Ultra Fast Settling", IEEE Transactions on Circuits and Systems—II: Express Briefs, Feb. 2007, pp. 181-185, vol. 54, No. 2, IEEE.

* cited by examiner

*Primary Examiner* — John Poos

(57) ABSTRACT

An all digital phase-locked loop (ADPLL) includes: a phase counter accumulating a frequency setting word value and the phase of a digitally controlled oscillator (DCO) clock and detecting a fine phase difference between a reference clock and a retimed clock; a phase detector detecting a digital phase error value compensating for a phase difference between the frequency setting word value and the DCO clock according to the fine phase difference to detect a digital phase error value; a digital loop filter filtering the digital phase error value and controlling PLL operational characteristics; a lock detector generating a lock indication signal according an output of the digital loop filter; a digitally controlled oscillator varying the frequency of the DCO clock according to the output from the digital loop filter; and a retimed clock generator generating the retimed clock by retiming the DCO clock at a low frequency.

18 Claims, 18 Drawing Sheets

TIME-TO-DIGITAL CONVERTER AND ALL DIGITAL PHASE-LOCKED LOOP INCLUDING THE SAME

CROSS-REFERENCE TO RELATED APPLICATIONS

This application claims the priorities of Korean Patent Application Nos. 10-2009-0127509 filed on Dec. 18, 2010, 10-2009-0127532 filed on Dec. 18, 2010, and 10-2010-0038681 filed on Apr. 26, 2010, in the Korean Intellectual Property Office, the disclosures of which are incorporated herein by reference.

BACKGROUND OF THE INVENTION

1. Field of the Invention

The present invention relates to an all digital phase-locked loop (ADPLL) and, more particularly, to a time-to-digital converter capable of reducing power consumption, noise, and area so as to accommodate a mobile communications terminal whose performance standard is strictly defined, and an ADPLL having the same.

2. Description of the Related Art

A charge pump phase-locked loop (PLL) has been largely used to design the existing RF frequency synthesizer for multi-band mobile communications, and an analog circuit designing technique is integrated into the charge pump PLL.

Thus, due to analog circuit and analog signal characteristics of the charge pump PLL, the charge pump PLL requires an analog/RF library in addition to design libraries provided by a standard digital CMOS process, so it is difficult to integrate the charge pump PLL together with a digital baseband signal processing block using a digital CMOS process.

In addition, the recent advancement of process techniques has emerged from the development of a nanometer digital CMOS process, which was prompted by rapidly developing digital baseband signal processing blocks.

In line with the progress in the development of nano-technology, digital circuits are being easily adapted to processing technologies desired to be manufactured and implemented, rather than being re-designed; however, an analog/RF circuit must be re-designed each time a process technology changes, and as CMOS processing technology advances toward the nano-scale, operational voltage is disadvantageously reduced.

Thus, because a large amount of time and expenses are required to improve the problems arising in designing an analog/RF integrated circuit according to the nano-class digital CMOS process, research and development into a digital RF is actively ongoing in an effort to digitalize an analog/RF circuit block.

In particular, a frequency synthesizer of an RF transceiver is part that can be fully digitalized. The technique of the digital PLL frequency synthesizer is a long-established technique, but because the digital PLL frequency synthesizer has phase noise and undesirable jitter characteristics, it has not been widely used as a local oscillator of a mobile communications RF transceiver requiring high quality phase noise.

However, recently, a novel type of all digital PLL (ADPLL) has been developed by applying a digital PLL technique to a mobile communications frequency synthesizer. The difference between the conventional digital PLL and the ADPLL lies in a digitally controlled oscillator (DCO). Namely, the conventional DCO is implemented through the use of a digital logic, while today's DCO is implemented through the use of an LC resonator.

Thus, the LC resonance DCO has excellent characteristics in terms of phase noise or jitter noise compared with the conventional digital logic.

The LC resonance DCO adjusts an oscillation frequency by controlling a fine variation of capacitance within the LC resonator, so a capacitor bank is divided into a coarse adjustment bank and a fine adjustment bank. The coarse adjustment bank of the DCO is used to quickly trace a PLL for the purpose of a desired PLL frequency, and when the target PLL frequency is approached by the coarse adjustment bank, the fine adjustment bank follows according to a mode conversion signal to lock on to the target PLL frequency through fine tracking.

A fine phase error ($\epsilon$) used for fine tracking is generated by a time-to-digital converter (TDC), and a fine phase difference between a reference clock and a DCO clock is compensated for by an arithmetic operation phase detector according to the fine phase error ($\epsilon$).

The phase noise performance of the existing digital PLL is determined by the resolution of the fine phase error ($\epsilon$) that can be detected by the TDC. Namely, in the case that the resolution of the fine phase error detected by the TDC (or the fine phase error detection resolution) is high, phase noise is improved, and the fine phase error detection resolution is determined by a minimum delay time of a delay element of an inverter chain constituting the TDC.

However, the inverter chain of the related art TDC is operated by using a DCO clock having a high frequency, causing excessive noise and much power consumption.

Also, as mentioned above, the existing DCO is divided into the coarse adjustment bank and the fine adjustment bank, so when the digital PLL is locked in a coarse locking mode, a lock indication signal is required for changing from the coarse adjustment bank of the DCO to the fine adjustment bank and, at this time, a lock detector is used.

A great number of lock detectors have been developed for the existing analog PLL, but not for the digital PLL, and in general, a look-up table which generally uses a memory and has a complicated structure is used.

In addition, the structure of the related art ADPLL is such that it uses narrowband, so it is difficult to use in other application fields using a broader bandwidth.

SUMMARY OF THE INVENTION

An aspect of the present invention provides a time-to-digital converter (TDC) operated by using a signal obtained by retiming a DCO clock at a low frequency to thus provide the same phase error detection capability as that of the related art and reduce power consumption, noise, and the area, and an all digital phase-locked loop (ADPLL).

Another aspect of the present invention provides a lock detector for use in an ADPLL having a simpler structure including a delay circuit and a comparison circuit, in the place of a look-up table which uses a memory and has a complicated structure.

According to an aspect of the present invention, there is provided an all digital phase-locked loop (ADPLL) including: a phase counter accumulating a frequency setting word value and the phase of a digitally controlled oscillator (DCO) clock and detecting a fine phase difference between a reference clock and a retimed clock; a phase detector compensating for a phase difference between the frequency setting word value and the DCO clock according to the fine phase difference between the reference clock and the retimed clock to detect a digital phase error value; a digital loop filter filtering the digital phase error value and controlling PLL operational characteristics; a lock detector detecting a point in time at which an output from the digital loop filter becomes uniform to generate a lock indication signal; a digitally controlled oscillator varying the frequency of the DCO clock according to an output from the digital loop filter while changing an operation mode according to the lock indication signal; and a retimed clock generator generating the retimed clock by retiming the DCO clock at a low frequency.

The retimed clock generator may include: a first latch circuit synchronized with a rising edge of the DCO clock to acquire and output a signal value of the reference clock to generate a rising edge retimed clock; and a second latch circuit synchronized with a falling edge of the DCO clock to acquire and output a signal value of the reference clock to generate a falling edge retimed clock.

The phase counter may include: a reference phase accumulator accumulating the phase of the frequency setting word according to the rising edge retimed clock; a variable phase accumulator accumulating the phase of the DCO clock; a sampler sampling a value of the variable phase accumulator according to the rising edge retimed clock to detect a variation of the DCO clock; and a time-to-digital converter (TDC) detecting a phase difference between the reference clock and the rising edge retimed clock.

The TDC may include: a delay chain delaying the phase of the reference clock; a sampler sampling an output from the delay chain according to the rising edge retimed clock and the falling edge retimed clock; an edge detector detecting a point in time at which an output value from the sampler changes to acquire a fine phase difference between the reference clock and the rising edge retimed clock and a fine phase difference between the reference clock and the falling edge retimed clock; and a normalization multiplier performing subtraction with respect to the fine phase difference between the reference clock and the rising edge retimed clock and the fine phase difference between the reference clock and the falling edge retimed clock, doubling a resultant value to calculate a DCO clock period, normalizing the fine phase difference between the reference clock and the rising edge retimed clock in the interval of the DCO clock period, and outputting the normalized fine phase difference.

The normalization multiplier may include: a subtractor performing subtraction with respect to the fine phase difference between the reference clock and the rising edge retimed clock and the fine phase difference between the reference clock and the falling edge retimed clock; an absolute value acquirer acquiring an absolute value of an output from the subtractor; a doubler doubling an output from the absolute value acquirer to acquire the DCO clock period; and a multiplier multiplying the fine phase difference between the reference clock and the rising edge retimed clock by a reciprocal number of the DCO clock period and outputting a resultant value.

The normalization multiplier may further include: a DCO clock period averager averaging the DCO clock period acquired by the doubler; a multiplexer selectively outputting one of the DCO clock period acquired by the doubler and the DCO clock period averaged by the averager; and a memory storing the DCO clock period selected by the multiplexer.

The TDC may include: a delay chain delaying the phase of the reference clock; a sampler sampling an output from the delay chain according to the rising edge retimed clock; an edge detector detecting a point in time at which the output value from the sampler changes to acquire the fine phase difference between the reference clock and the rising edge retimed clock; and a normalization multiplier acquiring a maximum value and a minimum value of the fine phase difference between the reference clock and the rising edge retimed clock, performing subtraction to calculate the DCO clock period, normalizing the fine phase difference between the reference clock and the rising edge retimed clock in the interval of the DCO period, and outputting the resultant value.

The normalization multiplier may include: a maximum value and minimum value detector detecting a maximum value and a minimum value of the fine phase difference between the reference clock and the rising edge retimed clock; a subtractor performing subtraction with respect to the maximum value and the minimum value to acquire the DCO clock period; and a multiplier multiplying the fine phase difference between the reference clock and the rising edge retimed clock by the reciprocal number of the DCO clock and outputting the same.

The normalization multiplier may further include: a multiplexer selectively outputting one of the DCO clock periods acquired by the subtractor and a pre-set DCO clock period; and a memory providing an output from the multiplexer to the multiplier.

The lock detector may include: a comparison unit comparing the output from the digital loop filter by bits; a delay cell block generating a plurality of delay signals each having a different phase from an output from the comparison unit and ORing the plurality of delay signals and the output from the comparison unit; and a detection unit detecting a point in time at which an output value from the delay cell block changes and outputting the lock indication signal.

The comparison unit may include: a plurality of delays delaying the phase of the output from the digital loop filter by bits; a plurality of comparators comparing the output from the digital loop filter and outputs from the plurality of delays; and an operator ORing the outputs from the plurality of comparators and outputting the same.

The delay cell block may include: a delay chain delaying the phase of the output from the comparison unit; and an operator ORing the output from the delay chain and the output from the comparison unit and outputting the same.

The detection unit may include: a latch circuit detecting a point in time at which the output value from the delay cell block changes; and a pulse generator outputting a lock indication signal in response to an output from the latch circuit.

The digitally controlled oscillator may select one of a coarse adjustment bank, an intermediate adjustment bank, and a fine adjustment bank according to the lock indication signal and vary a capacitance value of the selected adjustment bank according to the output from the digital loop filter to control the frequency of the DCO clock.

According to another aspect of the present invention, there is provided a time-to-digital converter (TDC) including: a delay chain delaying the phase of the reference clock; a sampler receiving a rising edge retimed clock and a falling edge retimed clock obtained by synchronizing the reference clock to a rising edge and a falling edge of a digitally controlled oscillator (DCO) clock and sampling an output from the delay chain; an edge detector detecting a point in time at which an output value from the sampler changes to acquire a fine phase difference between the reference clock and the rising edge retimed clock and a fine phase difference between the reference clock and the falling edge retimed clock; and a normalization multiplier performing subtraction with respect to the fine phase difference between the reference clock and the rising edge retimed clock and the fine phase difference between the reference clock and the falling edge retimed clock, doubling a resultant value to calculate a DCO clock period, normalizing the fine phase difference between the reference clock and the rising edge retimed clock in the interval of the DCO clock period, and outputting the normalized fine phase difference.

The normalization multiplier may include: a subtractor performing subtraction with respect to the fine phase difference between the reference clock and the rising edge retimed clock and the fine phase difference between the reference clock and the falling edge retimed clock; an absolute value acquirer acquiring an absolute value of an output from the subtractor; a doubler doubling an output from the absolute value acquirer to acquire the DCO clock period; and a multiplier multiplying the fine phase difference between the reference clock and the rising edge retimed clock by a reciprocal number of the DCO clock period and outputting a resultant value.

According to another aspect of the present invention, there is provided a time-to-digital converter (TDC) including: a delay chain delaying the phase of the reference clock; a sampler receiving a retimed clock obtained by synchronizing the reference clock to an output from a digitally controlled oscillator (DCO) and sampling an output from the delay chain; an edge detector detecting a point in time at which an output value from the sampler changes to acquire a fine phase difference between the reference clock and the rising edge retimed clock; and a normalization multiplier acquiring a maximum value and a minimum value of the fine phase difference between the reference clock and the rising edge retimed clock to calculate a DCO clock period, normalizing the fine phase difference between the reference clock and the rising edge retimed clock in the interval of the DCO clock period, and outputting the normalized fine phase difference.

The normalization multiplier may include: a maximum value and minimum value detector detecting a maximum value and a minimum value of the fine phase difference between the reference clock and the rising edge retimed clock; a subtractor performing subtraction with respect to the maximum value and the minimum value to acquire the DCO clock period; and a multiplier multiplying the fine phase difference between the reference clock and the rising edge retimed clock by the reciprocal number of the DCO clock and outputting the same.

According to another aspect of the present invention, there is provided a lock detector including: a comparison unit receiving a plurality of bit signals from a digital loop filter, and outputting a single bit signal including information regarding whether or not each of the plurality of bit signals is to be locked; a delay cell block combining the single bit signal and a signal obtained by delaying the single bit signal by a pre-set time, and outputting a single clock signal; and a detection unit detecting a point in time at which the signal value of the single clock signal changes, and outputting a lock indication signal for changing an operation mode of a digitally controlled oscillator (DCO).

BRIEF DESCRIPTION OF THE DRAWINGS

The above and other aspects, features and other advantages of the present invention will be more clearly understood from the following detailed description taken in conjunction with the accompanying drawings, in which:

FIG. 5A shows the related art TDC;

FIG. 5B shows the TDC according to an exemplary embodiment of the present invention;

FIG. 5C shows a fine phase error detected by the related art TDC;

FIG. 5D shows a fine phase error detected by the TDC according to an exemplary embodiment of the present invention;

FIG. 6A is a timing diagram of internal signals of the related art TDC;

FIG. 6B is a timing diagram of internal signals of the TDC according to an exemplary embodiment of the present invention;

DETAILED DESCRIPTION OF THE PREFERRED EMBODIMENT

Figure 1:
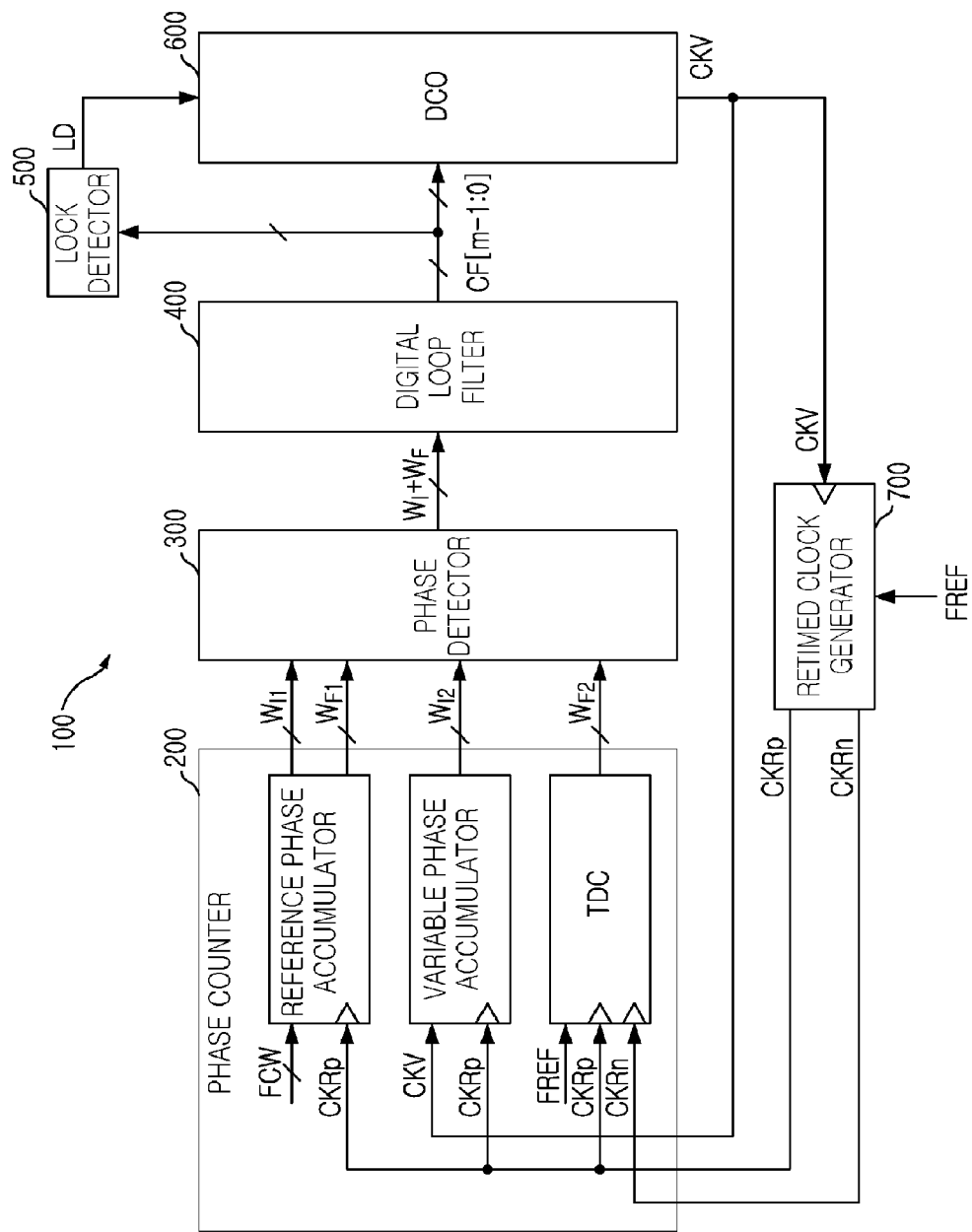
FIG. 1 is a schematic block diagram of an all digital phase-locked loop (ADPLL) according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In describing the present invention, if a detailed explanation for a related known function or construction is considered to unnecessarily divert from the gist of the present invention, such explanation will be omitted but would be understood by those skilled in the art.

In the drawings, the shapes and dimensions may be exaggerated for clarity, and the same reference numerals will be used throughout to designate the same or like components.

Unless explicitly described to the contrary, the word "comprise" and variations such as "comprises" or "comprising," will be understood to imply the inclusion of stated elements but not the exclusion of any other elements.

FIG. 1 is a schematic block diagram of an all digital phase-locked loop (ADPLL) according to an exemplary embodiment of the present invention.

With reference to FIG. 1, an all digital phase-locked loop (ADPLL) 100 may include a phase counter 200 accumulating a frequency setting word (FSW) and the phase of a digitally controlled oscillator (DCO) clock CKV and detecting a fine phase difference between a reference clock FREF and a rising edge retimed clock CKRp, a phase detector 300 compensating for a phase difference between the FSW and the DCO clock CKV according to the fine phase difference between the reference clock FREF and the rising edge retimed clock CKRp to detect a digital phase error value, a digital loop filter 400 filtering the digital phase error value and controlling PLL operational characteristics, a lock detector 500 detecting a point in time at which an output from the digital loop filter 400 becomes uniform to generate a lock indication signal LD, a digitally controlled oscillator (DCO) 600 changing an operation mode according to the lock indication signal LD and controlling the frequency of the DCO clock CKV according to an output from the digital loop filter 400, and a retimed clock generator 700 oversampling the DCO clock CKV at a low frequency to output retimed clocks CKRp and CKRn.

In this case, the retimed clock generator 700 may output one or more of the rising edge retimed clock CKRp obtained by synchronizing the reference clock FREF to a rising edge of the DCO clock CKV and the falling edge retimed clock CKRn obtained by synchronizing the reference clock FREF to a falling edge of the DCO clock CKV. The rising edge retimed clock CKRp is used as a clock for synchronizing a signal flow within the ADPLL 100, and the falling edge retimed clock CKRn is used as a clock for calculating one period Tv of the DCO clock CKV.

Figure 2:
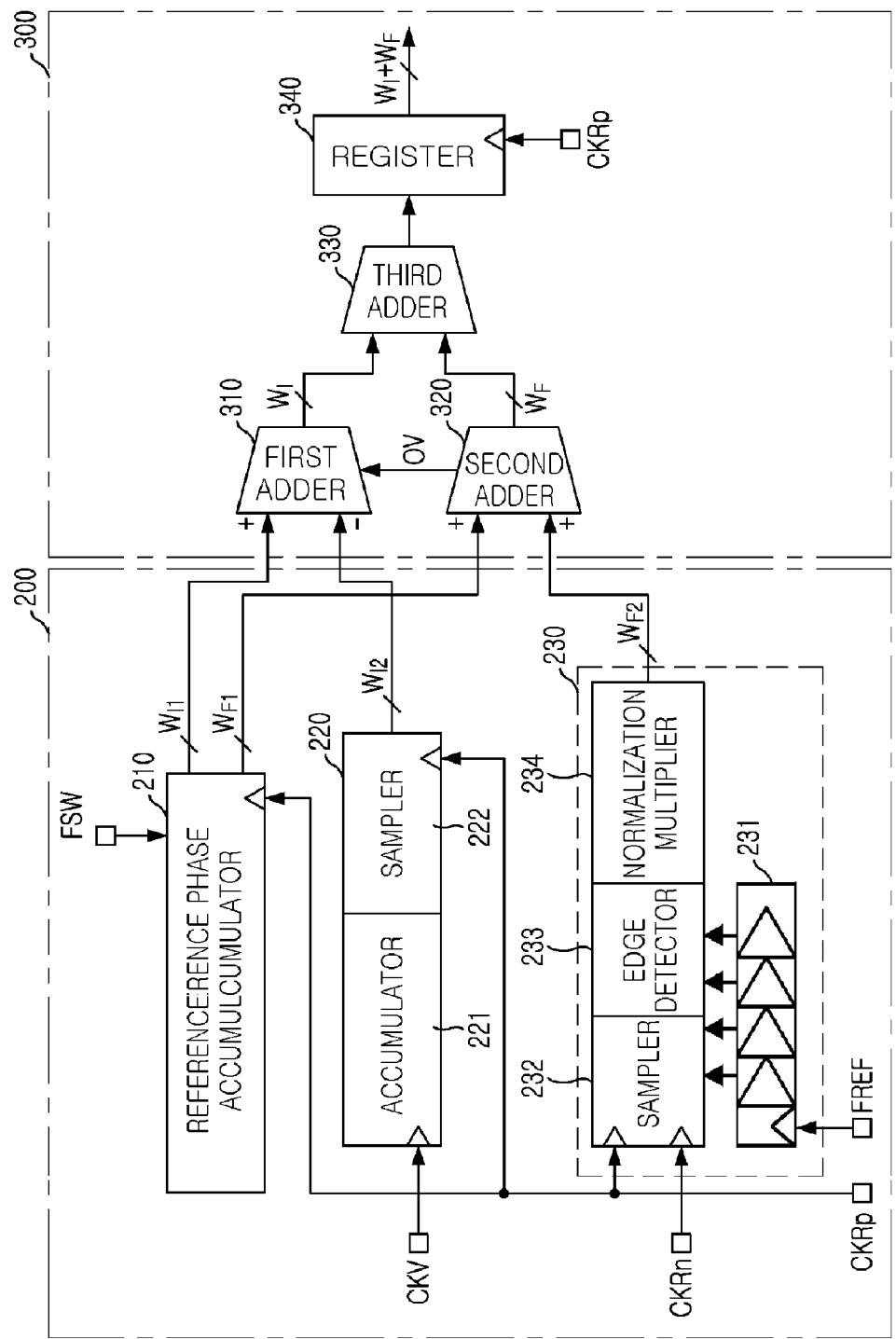
FIG. 2 is a detailed block diagram of a phase counter and a phase detector according to an exemplary embodiment of the present invention.

FIG. 2 is a detailed block diagram of a phase counter and a phase detector according to an exemplary embodiment of the present invention.

With reference to FIG. 2, the phase counter 200 may include a reference phase accumulator 210 accumulating the phase of the FSW according to the rising edge retimed clock CKRp, a variable phase accumulator 220 accumulating the DCO clock CKV and sampling a value of the variable phase accumulator 220 according to the rising edge retimed clock CKRp to detect a variation of the DCO clock CKV, and a time-to-digital converter (TDC) 230 detecting a phase difference between the reference clock FREF and the rising edge retimed clock CKRp.

In this case, the variable phase accumulator 220 may include an accumulator 221 accumulating the DCO clock CKV and a sampler 222 sampling an output from the accumulator 221 according to the rising edge retimed clock CKRp to generate a1-bit second integer word value $W_{12}$.

The TDC 230 may include a delay chain 231 gradually delaying the phase of the reference clock FREF to generate a plurality of delay signals each having a different phase, a sampler 232 sampling an output from the delay chain according to the rising edge retimed clock CKRp and the falling edge retimed clock CKRn, an edge detector 233 detecting a point in time at which an output value from the sampler changes to acquire a fine phase difference ($\epsilon_P$) (hereinafter, referred to as a 'rising edge phase error') between the reference clock FREF and the rising edge retimed clock CKRp and a fine phase difference ($\epsilon_N$) (hereinafter, referred to as a 'falling edge phase error') between the reference clock FREF and the falling edge retimed clock CKRn, and a normalization multiplier 234 performing subtraction with respect to the rising edge phase error ($\epsilon_P$) and the falling edge phase error ($\epsilon_N$), doubling a resultant value to calculate the DCO clock period Tv, normalizing the rising edge phase error ($\epsilon_P$) in the interval of the DCO clock period Tv, and outputting the same.

The operation of the phase counter 200 will now be described.

Unlike in the related art, the phase counter 200 further receives the rising edge retimed clock CKRp and the falling edge retimed clock CKRn obtained by retiming the DCO clock CKV at a low frequency, besides the FSW and the DCO clock CKV.

The reference phase accumulator 210 divides the FSW by an integer digital word i (i is a natural number) bit and a fractional digital word j (j is a natural number) bit and repeatedly accumulates the phase of a resultant value according to the rising edge retimed clock CKRp to generate i-bit first integer word value $W_{11}$ and j-bit first fractional word value $W_{F1}$. The variable phase accumulator 220 accumulates the DCO clock and samples it according to the rising edge retimed clock CKRp to generate a i-bit second integer word value $W_{12}$.

At the same time, the TDC 230 samples the reference clock FREF with the rising edge retimed clock CKRp and the falling edge retimed clock CKRn to acquire the rising edge phase error ($\epsilon_P$) and the falling edge phase error ($\epsilon_N$), performs subtraction thereupon, and doubles a resultant value to calculate the DCO clock period Tv, and normalizes the rising edge phase error ($\epsilon_P$) with the DCO clock period Tv to generate a j-bit second fractional word value $W_{F2}$.

In this manner, the phase counter 200 according to an exemplary embodiment of the present invention is operated by using the new signals, namely, the retimed clocks CKRp and CKRn obtained by retiming the DCO clock CKV at a low frequency.

In particular, unlike the related art, it is noted that the TDC 230 according to an exemplary embodiment of the present invention detects the phase difference between the reference clock FREF and the rising edge retimed clock CKRp, rather than the phase difference between the reference clock FREF and the DCO clock CKV. In this case, however, because the retimed clocks CKRp and CKRn are in synchronization with the DCO clock CKV, the TDC 230 according to an exemplary embodiment of the present invention can have the same phase error detection capability as that of the related art TDC. This will be described in more detail later with reference to FIGS. 5 and 6.

That is, the TDC 230 according to an exemplary embodiment of the present invention is operated by using the retimed clocks CKRp and CKRn obtained by oversampling the reference clock FREF of a low frequency with the DCO clock CKV, thereby providing the same phase error detection capability as that of the related art, while reducing power consumption and noise.

With reference to FIG. 2, the phase detector 300 includes a first adder 310 obtaining the difference between the first integer word value $W_{11}$ and the second integer word value $W_{12}$, a second adder 320 obtaining the sum of the first fractional word value $W_{F1}$ and the second fractional word value $W_{F2}$, a third adder 330 adding outputs from the first and second adders 310 and 320 and outputting a resultant value, a register 340 synchronized with the rising edge retimed clock CKRp to output an output from the third adder 330 to the digital loop filter 400, and the like.

The operation of the phase detector 300 will now be described.

The first adder 310 performs subtraction with respect to the first integer word value $W_{I1}$ acquired by the reference phase accumulator 210 and the second integer word value $W_{I2}$ acquired by the variable phase accumulator 220. In this case, An integer word value ($W_I = W_{I1} - W_{I2}$) obtained from the subtraction operation is inputted to the digital loop filter 400 through the third adder 330 and the register 340. The digital loop filter 400 scales down the value and provides the same to the DCO 600 so that a coarse adjustment bank and an intermediate adjustment bank provided in the DCO 600 can be controlled by the integer word value ($W_I = W_{I1} - W_{I2}$).

Simultaneously, the second adder 320 adds the first fractional word value WF1 acquired by the reference phase accumulator 210 and the second fractional word value WF2 acquired by the TDC 230 and provides a 1-bit rounded-off signal OV as a carry input to the first adder 310 and a j-bit added prime word value ($W_E = W_{F1} + W_{F2}$) to the digital loop filter 400 through the third adder 330 and the register 340. The digital loop filter 400 then scales it down and provides the resultant value to the DCO 600, so that the intermediate adjustment bank and a fine adjustment capacitor band provided in the DCO 600 can be controlled by the added fractional word value ($W_F = W_{F1} + W_{F2}$).

When the word width $W_1$ of the integer digital value is 8 bits and the word width $W_F$ of the fractional digital value is 15 bits, the digital phase error value ($W_1 + W_F$) of the phase detector 300 totals 23 bits. The operation of the ADPLL 100 by employing the digital phase error value ($W_1 + W_F$) totaling 23 will now be described as follows.

A PLL frequency of the ADPLL 100 is set by a digital value of the FSW, and a PLL continuously tracks a digital phase error value of the phase detector 300 so that the PLL frequency set by the FSW can be locked.

The phase detector 300 performs arithmetic operation by using the phase counter 200 operated upon receiving the FSW, DCO clock CKV, and the retimed clocks CKRp and CKRn, thus detecting a phase error between the FSW and the accumulated DCO phase value.

The detected phase error is provided as a 23-bit digital signal in binary form to the digital loop filter 400, and the digital loop filter 400 scales down the received 23-bit digital phase error value to have a smaller bit value, and outputs the same.

Then, the lock detector 500 analyzes an m-bit output signal output from the digital loop filter 400 to generate a lock indication signal for changing an operation mode of the DCO 600, and the DCO 600 selects one of the coarse adjustment capacitor bank, the intermediate adjustment bank and the fine adjustment bank according to the lock indication signal and controls a capacitor value of the selected bank according to the m-bit output signal, thus adjusting the frequency of the DCO clock CKV.

When the frequency of the DCO clock CKV is continuously changed according to the digital phase error value detected by the phase detector 300, the ADPLL 100 is eventually locked at the frequency set by the FSW value.

Figure 3A:
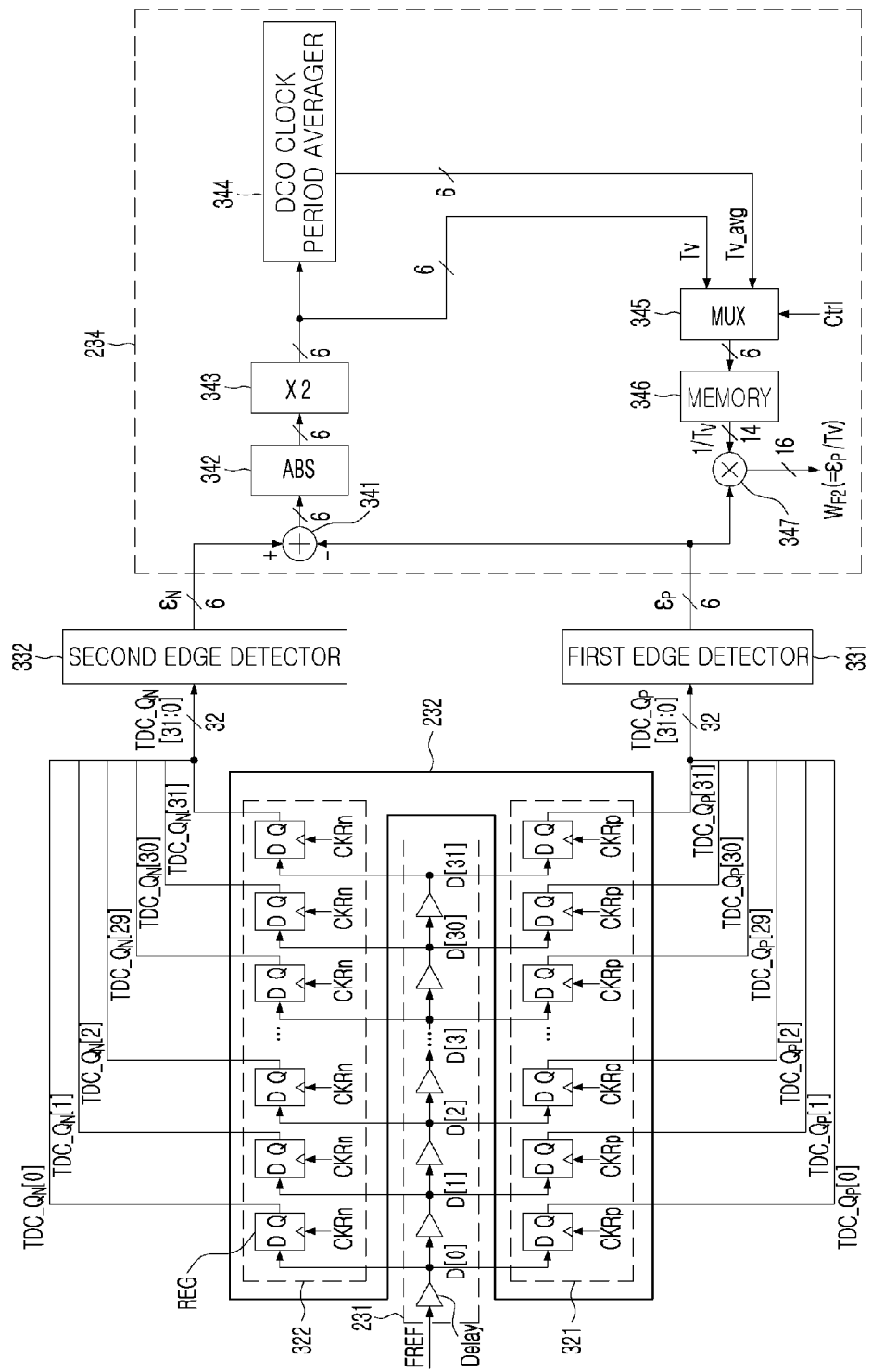
FIG. 3a is a detailed block diagram of a time-to-digital converter (TDC) according to an exemplary embodiment of the present invention.

FIG. 3a is a detailed block diagram of a time-to-digital converter (TDC) according to an exemplary embodiment of the present invention.

With reference to FIG. 3a, the TDC 230 may include a delay chain 231, a sampler 232, an edge detector 233, a normalization multiplier 234, and the like.

The delay chain 231 may include a plurality of delays connected in series. The sampler 232 may include a first register array 321 including a plurality of registers REG sampling an output from the delay chain 231 according to the rising edge retimed clock CKRp and outputting the same, and a second register array 322 sampling the output from the delay chain 231 according to the falling edge retimed clocks CKRn and outputting the same. In this case, the register REG may be implemented as a D-FF, or the like.

The edge detector 233 may include a first edge detector 331 detecting a point in time at which an output value from the first register array 321 changes to acquire the rising edge phase error ($\epsilon_P$) and a second edge detector 332 detecting a point in time at which an output value from the second register array 322 changes to acquire the falling edge phase error ($\epsilon_N$).

The normalization multiplier 234 may include a subtractor 341 performing subtraction with respect to the rising edge phase error ($\epsilon_P$) and the falling edge phase error ($\epsilon_N$) and outputting a resultant value, an absolute value acquirer (ABS) 342 acquiring an absolute value of an output value ($\epsilon_N - \epsilon_P$) from the subtractor 341, a doubler (X2) 343 doubling an output from the absolute value acquirer 342 to acquire the DCO clock period Tv, a DCO clock period averager 344 acquiring an average of the DCO clock period, a multiplexer (MUX) 345 selectively outputting one of the DCO clock period Tv acquired by the doubler 343 and the average value Tv_avg of the DCO clock period acquired by the DCO clock period averager 344 according to a multiplexer control signal ctrl, a memory 346 storing the DCO clock period selected by the multiplexer 345, and a multiplier 347 multiplying the rising edge phase error ($\epsilon_P$) by a reciprocal number of the DCO clock period stored in the memory 346 to generate a second fractional word value $W_{F2}$, and outputting the generated second fractional word value $W_{F2}$.

In this case, the normalization multiplier 234 acquires the average value of the DCO clock period through the DCO clock period averager 344 and normalizes the rising edge phase error ($\epsilon_P$) through the acquired average value, thus having increased linear characteristics. In addition, the multiplexer control signal ctrl is activated when an operation mode of the DCO 600 is the fine adjustment mode, and the multiplexer 345 outputs the average value of the DCO clock period in response to the multiplexer control signal ctrl. Thus, while the DCO 600 is operated in the fine adjustment mode, the normalization multiplier 234 can normalize the rising edge phase error ($\epsilon_P$) according to the average value of the DCO clock period.

Figure 3B:
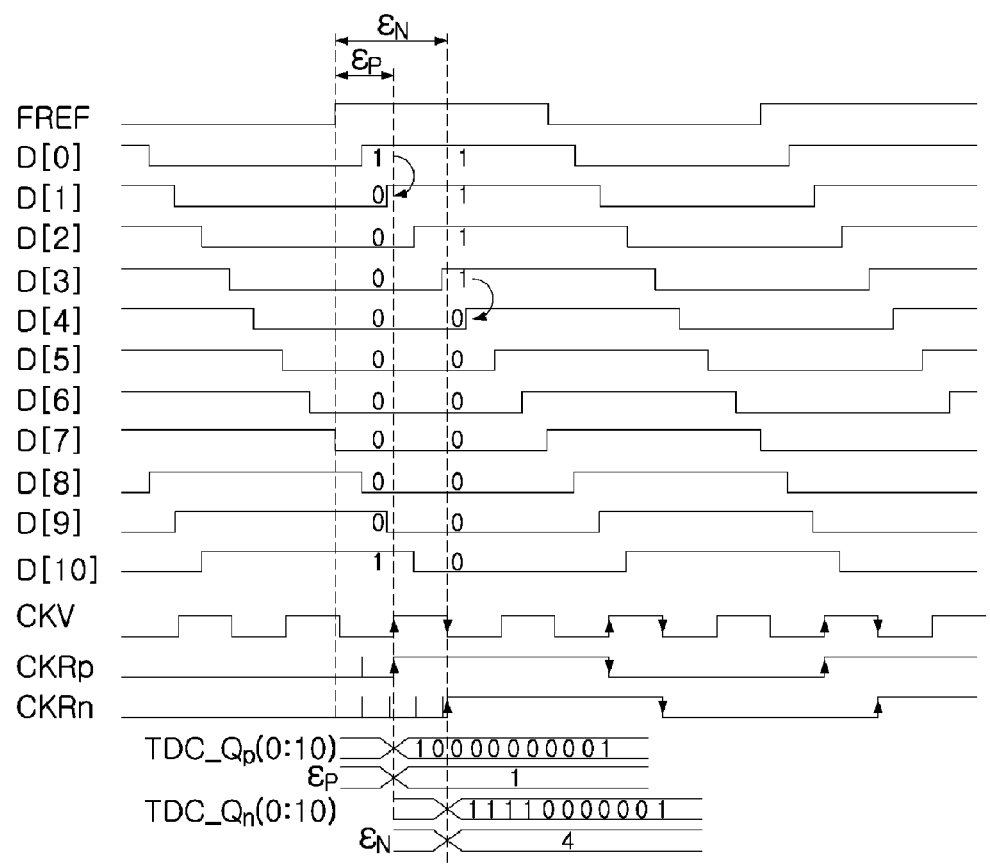
FIG. 3b is a view for explaining the operation of the TDC according to an exemplary embodiment of the present invention.

The operation of the TDC 230 will now be described with reference to FIG. 3b. In FIG. 3b, D[0] to D[10] refer to output signals output from the plurality of delays of the delay chain 231.

First, the delay chain 231 delays the phase of the reference clock FREF little by little by a delay time of a single delay and provides it as an input to the first and second register arrays 321 and 322.

The first register array 321 is synchronized with the rising edge retimed clock CKRp to sample the output from the delay chain 231 to output TDC-Qp having a value (10000000001) corresponding to a phase difference between the reference clock FREF and the rising edge retimed clock CKRp, and the second register array 322 is synchronized with the falling edge retimed clock CKRn to sample the output from the delay chain 231 to output TDC-Qn having a value (11110000001) corresponding to a phase difference between the reference clock FREF and the falling edge retimed clock CKRn. In this case, the output signals (TDC_Qp, TDC_Qn) from the first and second register arrays 321 and 322 may have a form of a pseudo thermometer code.

The first and second edge detectors 331 and 332 then detect a point in time at which the output values of the first and second register arrays 321 and 322 change (namely, the number of '1' until such time as a signal value is changed from 1 to 0 is detected) to acquire the rising edge phase error and the falling edge phase error ($\epsilon_P$, $\epsilon_N$). Namely, the first and second edge detectors 331 and 332 output the rising edge phase error ($\epsilon_P$=1) and the falling edge phase error ($\epsilon_N$=4) in response to TDC_Qp (=10000000001) and TDC_Qn (=11110000001). The detection operations of the first and second edge detectors 331 and 332 can be represented as shown in Table 1 below. In this case, Table 1 shows an example of a detection operation performed when the first edge detector 331 generates 6-bit output signal upon receiving 32 signals from the first register array 321, and EPnum refers to a value of the rising edge phase error.

TABLE 1

Pseudo-thermometer code

| TDC_Qp[31:0] | EPnum [5:0] |
|---|---|
| xxxx_xxxx_xxxx_xxxx_xxxx_xxxx_xxxx_x001 | 1 |
| xxxx_xxxx_xxxx_xxxx_xxxx_xxxx_xxxx_0011 | 2 |
| xxxx_xxxx_xxxx_xxxx_xxxx_xxxx_xxx0_0111 | 3 |
| xxxx_xxxx_xxxx_xxxx_xxxx_xxxx_xx00_1111 | 4 |
| xxxx_xxxx_xxxx_xxxx_xxxx_xxxx_x001_1111 | 5 |
| xxxx_xxxx_xxxx_xxxx_xxxx_xxxx_0011_1111 | 6 |
| xxxx_xxxx_xxxx_xxxx_xxxx_xxx0_0111_1111 | 7 |
| xxxx_xxxx_xxxx_xxxx_xxxx_xx00_1111_1111 | 8 |
| xxxx_xxxx_xxxx_xxxx_xxxx_x001_1111_1111 | 9 |
| xxxx_xxxx_xxxx_xxxx_xxxx_0011_1111_1111 | 10 |
| xxxx_xxxx_xxxx_xxxx_xxx0_0111_1111_1111 | 11 |
| xxxx_xxxx_xxxx_xxxx_xx00_1111_1111_1111 | 12 |
| xxxx_xxxx_xxxx_xxxx_x001_1111_1111_1111 | 13 |
| xxxx_xxxx_xxxx_xxxx_0011_1111_1111_1111 | 14 |
| xxxx_xxxx_xxxx_xxx0_0111_1111_1111_1111 | 15 |
| xxxx_xxxx_xxxx_xx00_1111_1111_1111_1111 | 16 |
| xxxx_xxxx_xxxx_x001_1111_1111_1111_1111 | 17 |
| xxxx_xxxx_xxxx_0011_1111_1111_1111_1111 | 18 |
| xxxx_xxxx_xxx0_0111_1111_1111_1111_1111 | 19 |
| xxxx_xxxx_xx00_1111_1111_1111_1111_1111 | 20 |
| xxxx_xxxx_x001_1111_1111_1111_1111_1111 | 21 |
| xxxx_xxxx_0011_1111_1111_1111_1111_1111 | 22 |
| xxxx_xxx0_0111_1111_1111_1111_1111_1111 | 23 |
| xxxx_xx00_1111_1111_1111_1111_1111_1111 | 24 |
| xxxx_x001_1111_1111_1111_1111_1111_1111 | 25 |
| xxxx_0011_1111_1111_1111_1111_1111_1111 | 26 |
| xxx0_0111_1111_1111_1111_1111_1111_1111 | 27 |
| xx00_1111_1111_1111_1111_1111_1111_1111 | 28 |
| x001_1111_1111_1111_1111_1111_1111_1111 | 29 |
| 0011_1111_1111_1111_1111_1111_1111_1111 | 30 |
| 0111_1111_1111_1111_1111_1111_1111_1111 | 31 |
| 0000_0000_0000_0000_0000_0000_0000_0000 | else |

Finally, the normalization multiplier 234 performs subtraction with respect to the rising edge phase error and the falling edge phase error ($\epsilon_P$, $\epsilon_N$), doubles a resultant value to acquire the DCO clock period Tv, and divides the rising edge phase error ($\epsilon_P$) through the DCO clock period Tv to acquire the second fractional word value $W_{F2}$. Such an operation of the normalization multiplier 234 may be represented by Equation 1 shown below:

$$W_{F2} = \epsilon_P/Tv$$

$$Tv = 2 \times |\epsilon_P - \epsilon_N|$$ [Equation 1]

In this manner, the TDC 230 according to an exemplary embodiment of the present invention can detect a fine phase error required for compensating for a phase difference between the FSW and the accumulated DCO phase value by using the retimed clocks CKRp and CKRn obtained by oversampling the reference clock FREF of a low frequency with the DCO clock CKV.

In the above description, the TDC 230 is operated by using the two retimed clocks CKRp and CKRn, but if necessary, the TDC may be operated by using only one of the retimed clocks CKRp and CKRn.

Figure 4A:
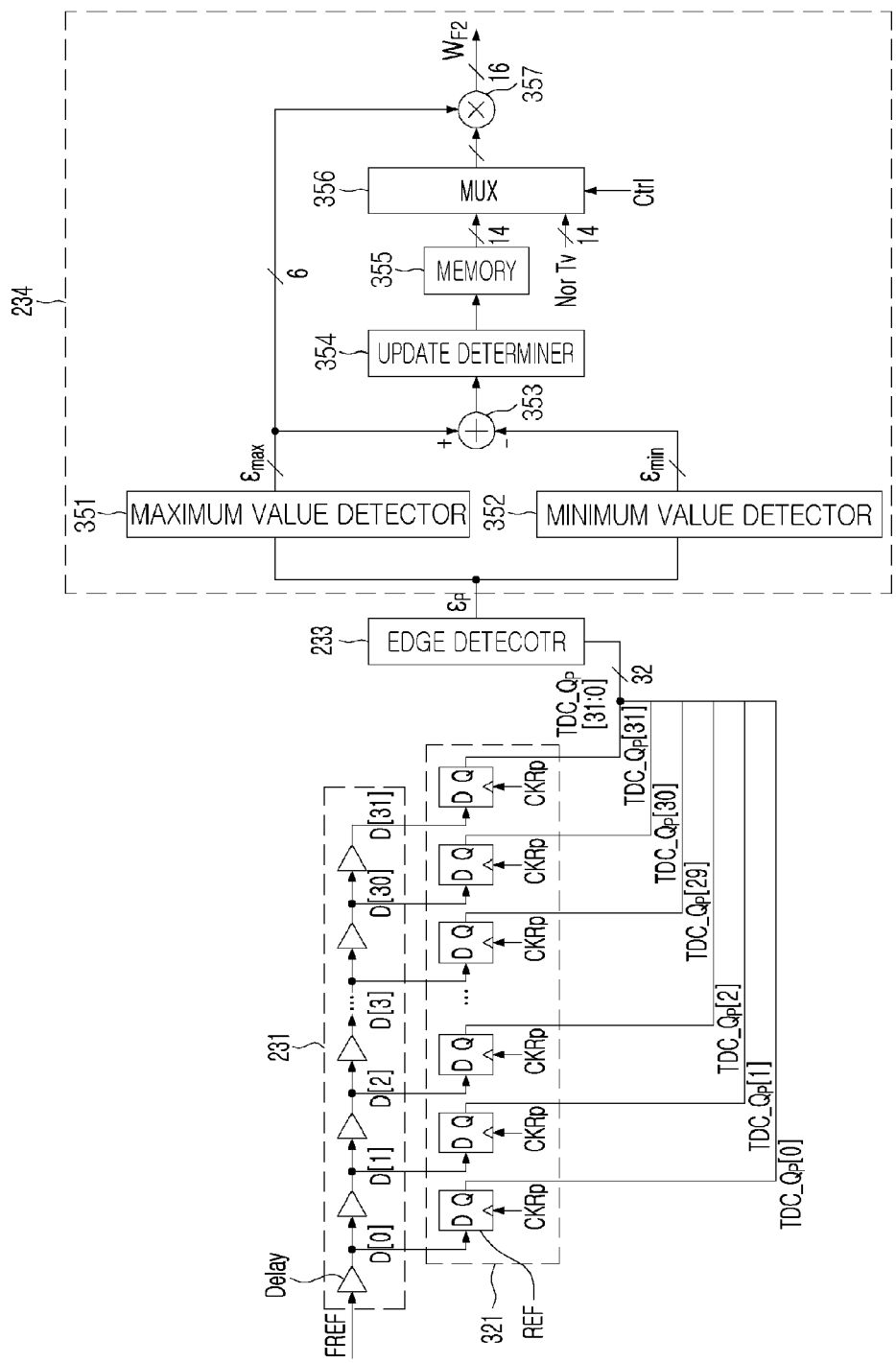
FIG. 4A is a detailed block diagram of a time-to-digital converter (TDC) according to another exemplary embodiment of the present invention.

FIG. 4A is a detailed block diagram of a time-to-digital converter (TDC) according to another exemplary embodiment of the present invention.

With reference to FIG. 4A, the TDC 230 may include a delay chain 231 delaying the phase of the reference clock FREF little by little to generate a plurality of delay signals each having a different phase, a sampler 232 sampling an output from the delay chain 231 according to the rising edge retimed clock CKRp, an edge detector 233 detecting a point in time at which the output value from the sampler 232 changes to acquire the fine phase difference ($\epsilon_P$) (namely, a rising edge phase error) between the reference clock FREF and the rising edge retimed clock CKRp, and a normalization multiplier 234 acquiring a maximum value and a minimum value of the rising edge phase error ($\epsilon_P$), performing subtraction to calculate the DCO clock period Tv, normalizing the rising edge phase error ($\epsilon_P$) in the interval of the DCO period Tv, and outputting the resultant value.

In detail, the delay chain 231 may include a plurality of delays connected in series. The sampler 232 may include a plurality of registers REG sampling an output from the delay chain 231 according to the rising edge retimed clock CKRp and outputting the same. In this case, the register REG may be implemented as a D-FF, or the like.

The normalization multiplier 234 may include a maximum value detector 351 detecting a maximum value (max($\epsilon$)) of the rising edge phase error ($\epsilon_P$), a minimum value detector 352 detecting a minimum value (min($\epsilon$)) of the rising edge phase error ($\epsilon_P$), a subtractor 353 performing subtraction with respect to the maximum value (max($\epsilon$)) and the minimum value (min($\epsilon$)) to calculate the DCO clock period Tv, a memory 355 storing the DCO clock period Tv, a multiplexer (MUX) 356 selectively outputting one of the DCO clock period stored in the memory 355 and a pre-set DCO clock period, and a multiplier 357 multiplying the rising edge phase error ($\epsilon_P$) by a reciprocal number of the DCO clock periods selected by the MUX 356 to generate the second fractional word value ($W_{F2}$), and outputs the generated second fractional word value ($W_{F2}$).

In addition, the normalization multiplier 234 may further include an update determiner 354 determining to store the DCO clock period Tv, which has been acquired through the subtractor 353, in the memory 355 only when the operation mode of the DCO 600 is the fine adjustment mode. The DCO clock period Tv stored in the memory 355 may be one of the DCO clock period Tv acquired through the subtractor 353 and an average value of the DCO clock period Tv as described above.

The multiplexer control signal ctrl of FIG. 4A is also activated when the operation mode of the DCO 600 is the fine adjustment mode, and the multiplexer 356 outputs the pre-set DCO clock period in response to the multiplexer control signal ctrl. Thus, while the DCO 600 is operated in the fine adjustment mode, the normalization multiplier 234 can normalize the rising edge phase error ($\epsilon_P$) according to the pre-set DCO clock period. The pre-set DCO clock period is determined by a PLL frequency set by the FSW.

Figure 4B:
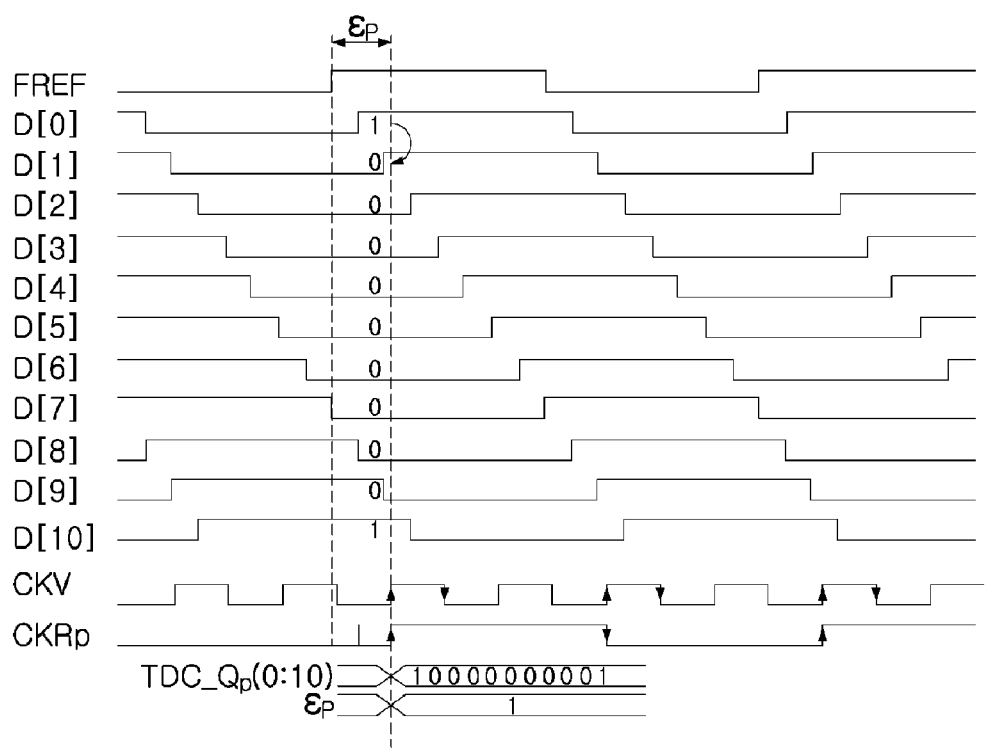
FIG. 4B is a view for explaining the operation of the TDC according to another exemplary embodiment of the present invention.

The operation of the TDC 230 will now be described with reference to FIG. 4B. In FIG. 4B, D[0] to D[10] refer to output signals output from the plurality of delays of the delay chain 231.

First, when the reference clock FREF is inputted to the delay chain 231, the phase of the reference clock FREF is delayed little by little by a delay time of a single delay while passing through the delay chain 231, and then provided as an input to the sampler 232.

The sampler 232 is synchronized with the rising edge retimed clock CKRp through the plurality of registers REG to sample an output from the delay chain 231, and outputs TDC_Qp having a value (e.g., 10000000001) corresponding to the phase difference between the reference clock FREF and the rising edge retimed clock CKRp, and the edge detector 233 detects a point in time at which an output value from the sampler 232 changes (namely, the number of '1' until such time as a signal value is changed from 1 to 0 is detected) to acquire the rising edge phase error ($\epsilon_P$).

Finally, the normalization multiplier 234 detects the maximum value (max($\epsilon$)) and the minimum value (min($\epsilon$)) of the rising edge phase error ($\epsilon_P$), performs subtraction with respect to the maximum value (max($\epsilon$)) and the minimum value (min($\epsilon$)) to calculate the DCO clock period Tv, and normalizes the rising edge phase error ($\epsilon_P$) with the DCO clock period Tv to acquire the second decimal word value WF2. Such an operation of the normalization multiplier 234 can be represented by Equation 2 shown below:

$$W_{F2} = \epsilon_P / Tv$$

$$Tv = \max(\epsilon_P) - \min(\epsilon_P) \quad \text{[Equation 2]}$$

FIGS. 5A to 5D, and 6A to 6B are views for explaining the operational performance of the TDC in detail according to an exemplary embodiment of the present invention.

Figures 5A, 5B:
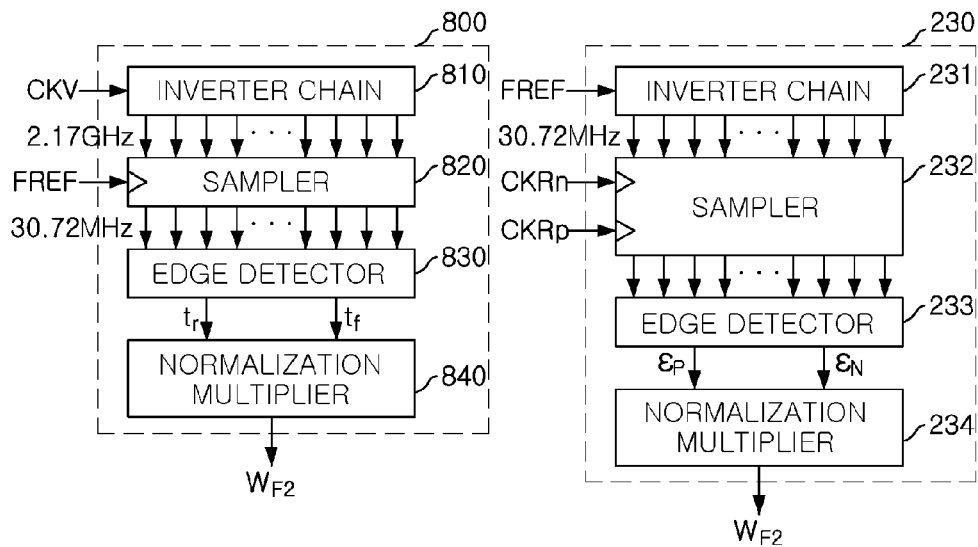
FIGS. 5A to 5D and 6A to 6B are views for explaining the operational performance of the TDC in detail according to an exemplary embodiment of the present invention.
Figure 6A:
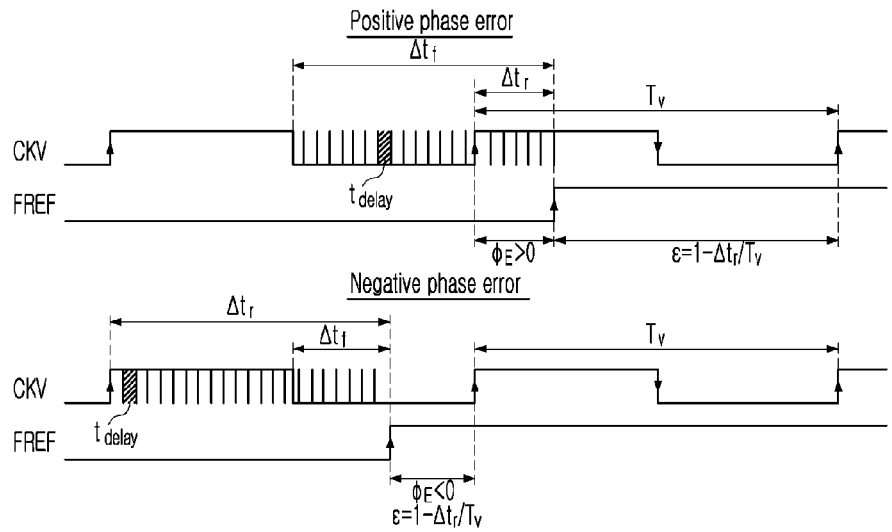

In FIG. 5A shows the related art TDC, 5B shows the TDC according to an exemplary embodiment of the present invention, 5C shows a fine phase error detected by the related art TDC, and 5D shows a fine phase error detected by the TDC according to an exemplary embodiment of the present invention. In FIG. 6A is a timing diagram of internal signals of the related art TDC and 6B is a timing diagram of internal signals of the TDC according to an exemplary embodiment of the present invention.

With reference to FIGS. 5A and 5B, it is noted that the related art TDC 800 detects a phase difference between the DCO clock CKV and the reference clock FREF by directly using the DCO clock CKV and the reference clock FREF, but the TDC 230 according to an exemplary embodiment of the present invention detects a phase difference between the DCO clock CKV and the reference clock FREF by using the retimed clocks CKRp and CKRn obtained by oversampling the reference clock FREF of a low frequency with the DCO clock CKV and the reference clock FREF.

In addition, the related art TDC 800 must be operated at a high speed according to the DCO clock CKV (e.g., 2.17 GHz), causing excessive power consumption and noise, yet the TDC 230 according to an exemplary embodiment of the present invention can be operated at a low speed according to the retimed clocks CKRp and CKRn obtained by oversampling the reference clock FREF of a low frequency with the DCO clock CKV, causing less power consumption and noise. For reference, as power of the digital PLL is mostly consumed by the TDC and DCO, the reduction in power consumption of the TDC will greatly contribute to reduce power consumption of overall PLL.

Figures 5C, 5D:
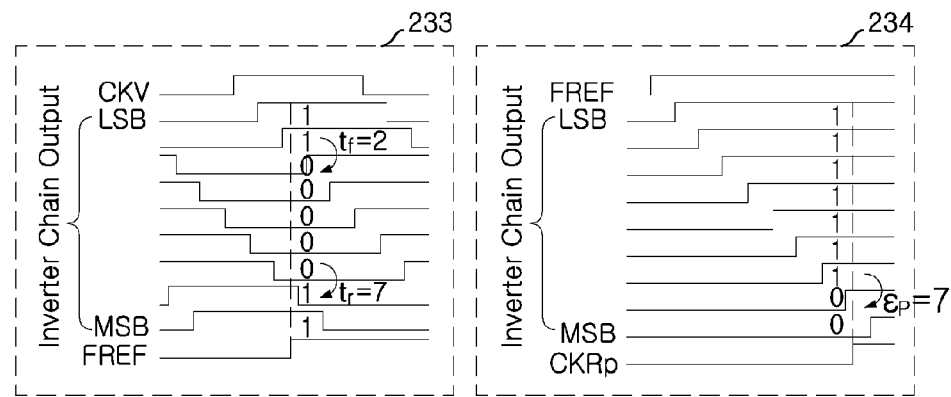

In addition, as described above, because the TDC 230 according to an exemplary embodiment of the present invention uses the retimed clocks CKRp and CKRn in synchronization with the DCO clock CKV, the fine phase error ($\epsilon$) between the reference clock FREF and the DCO clock CKV and the fine phase error ($\epsilon$) between the reference clock FREF and the rising edge retimed clock CKRp have the same value, as shown in FIGS. 5C and 5D. Namely, the TDC 230 according to an exemplary embodiment of the present invention can have the same phase error detection capability as that of the related art TDC 800.

The process of detecting a fine phase error of the related art TDC 800 and that of the TDC 230 according to an exemplary embodiment of the present invention will now be compared with reference to FIGS. 5C and 6A.

First, with reference to FIGS. 5C and 6A, in the related art TDC 800, the DCO clock CKV is input to a delay chain 810, and while the DCO clock CKV is passing through the delay chain 810 by a delay time ($t_{delay}$) of a single delay, the phase of the DCO clock CKV is delayed little by little.

A sampler 820 samples an output from the delay chain 810 by using the reference clock FREF, and an edge detector 830 detects a point in time at which the sampling result changes to acquire a rising edge ($t_r$) and a falling edge ($t_f$). In this case, the rising edge ($t_r$) is a variable for measuring a time difference between a rising edge of the DCO clock CKV and that of the reference clock FREF, and the falling edge ($t_f$) is a variable for measuring a time difference between a falling edge of the DCO clock CKV and the rising edge of the reference clock FREF.

For example, with reference to FIG. 5C, the rising edge ($t_r$) may appear as an integer value 2 according to the number of 1 until such time as the sampling result of the sampler 820 is changed from 1 to 0, and the falling edge ($t_f$) may appear as an integer value 7 according to the number of 1 until such time as the sampling result of the sampler 820 is changed from 0 to 1.

Then, the normalization multiplier 840 calculates the DCO clock period Tv and the fine phase error ($\epsilon$) according to Equation 3 shown below, and acquires the decimal word value ($W_{F2}$) by dividing the fine phase error ($\epsilon$) by the DCO clock period Tv.

$$Tv = 2 \times |\Delta t_r - \Delta t_f|$$

$$\epsilon_r = Tv - \Delta t_r$$

$$W_{F2} = \epsilon = (Tv - \Delta t_r)/Tv \quad \text{[Equation 3]}$$

In this case, the fine phase error ($\epsilon$) and the DCO clock period Tv can be represented as the number of delays, so in order to accurately measure the DCO clock period Tv according to Equation 3, the related art TDC 800 must include delays by the number corresponding to the DCO clocks CKV of two periods.

Figure 6B:
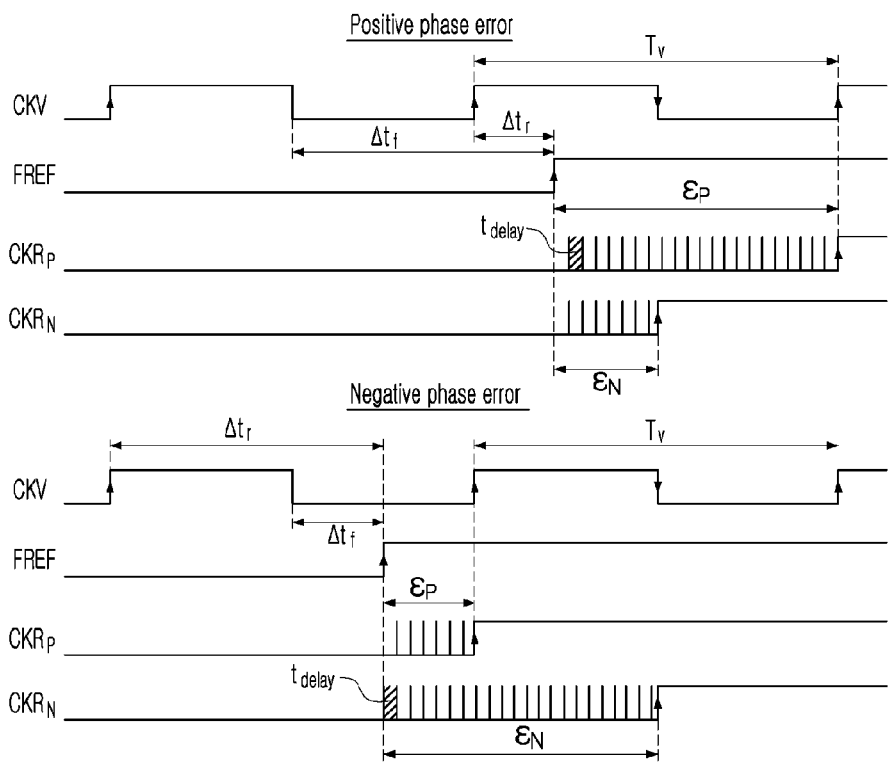

In comparison, the process of detecting the fine phase error by the TDC 230 according to an exemplary embodiment of the present invention will now be described with reference to FIGS. 5D and 6B.

The TDC 230 according to an exemplary embodiment of the present invention inputs the reference clock FREF, instead of the DCO clock CKV, to the delay chain 231, and while the reference clock FREF is passing through the delay chain 231 by a delay time ($t_{delay}$) of a single delay, the phase of the reference clock FREF is delayed little by little.

The sampler 232 samples an output from the delay chain 231 by using the rising edge retimed clock CKRp and the falling edge retimed clock CKRn, and the edge detector 233 detects a point in time at which the sampling result changes to acquire the values of the rising edge phase error and the falling edge phase error ($\epsilon_P, \epsilon_N$).

The normalization multiplier 234 acquires the DCO clock period Tv from the rising edge phase error and the falling edge phase error ($\epsilon_P, \epsilon_N$) according to Equation 1 (or Equation 2) and acquires the second fractional word value WF2 by dividing the rising edge phase error ($\epsilon_P$) by the DCO clock period Tv.

With reference to FIG. 5D, the rising edge phase error ($\epsilon_P$) may appear as an integer value 7 according to the number of 1 until such time as the sampling result of the first register 321 changes from 1 to 0, which corresponds exactly to the number of the delays, namely, seven delays, the phase errors ($\epsilon_P, \epsilon_N$) and the DCO clock period Tv according to an exemplary embodiment of the present invention can be also represented as the number of delays.

However, as represented by Equation 1 (or Equation 2) above, the TDC 230 according to an exemplary embodiment of the present invention requires only the number of delays enough for measuring a maximum one period to measure the DCO clock period Tv, so the number of delays can be reduced by approximately 50 percent compared with the related art TDC 800, and accordingly, power consumption, noise, and the area can be also reduced by approximately 50 percent.

The number of delays required for the TDC 230 according to an exemplary embodiment of the present invention is ideally represented by Equation 4 shown below, but in actuality, a delay corresponding to a delay time of a latch circuit of the retimed clock generator 700 generating the retimed clocks CKRp and CKRn is necessarily added, so the total number of delays required for the TDC 230 can be represented by Equation 5 shown below:

$$NUM_{delay} = \frac{T_v}{\Delta t_{delay}} \quad \text{[Equation 4]}$$

$$NUM_{delay} = \frac{T_v + \Delta t_{D-F/F}}{\Delta t_{delay}} \quad \text{[Equation 5]}$$

In Equation 5, $\Delta t_{delay}$ is a delay time of a delay, and $\Delta t_{D-F/F}$ is a delay time of a latch circuit provided in the retimed clock generator.

As discussed above, when the related art TDC 800 is in use, the number of delays which correspond to two periods (2xTv) of the DCO clock CKV is required to measure the DCO clock period TV, whereas when the TDC 230 according to an exemplary embodiment of the present invention is in use, only one or two delays need to be added to the number of delays which correspond to one period Tv of the DCO clock in order to measure the DCO clock period. Namely, when twenty-four delays correspond to the DCO clock period, the use of the related art TDC 800 requires a total of forty-eight delays, while the use of the TDC 230 according to an exemplary embodiment of the present invention requires only a total of twenty-five delays.

As a result, the TDC 230 according to an exemplary embodiment of the present invention can reduce the number of required delays by approximately 50 percent, compared with the related art TDC 800, such that power consumption, noise, and the area can be drastically reduced.

Figure 7:
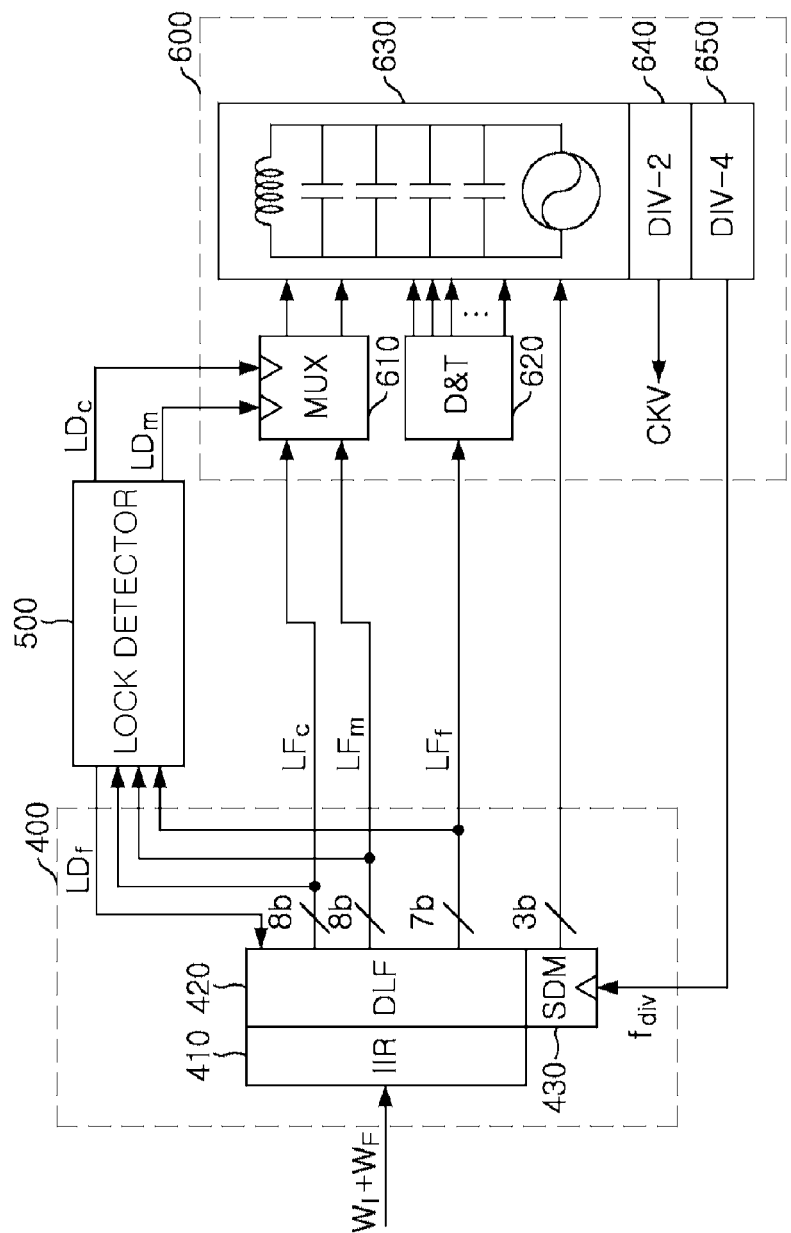
FIG. 7 is a detailed block diagram showing a digital loop filter, a lock detector, and a digitally controlled oscillator (DCO) according to an exemplary embodiment of the present invention.

FIG. 7 is a detailed block diagram showing a digital loop filter, a lock detector, and a digitally controlled oscillator (DCO) according to an exemplary embodiment of the present invention.

With reference to FIG. 7, the digital loop filter 400 may include an IIR filter 410 for filtering the phase detector 300, a digital low pass filter (DLF) 420 for determining the gain of a loop filter and a PLL bandwidth, and a sigma-delta modulator (SDM) 430 for controlling the fine adjustment capacitor bank of the DCO 600 upon receiving a portion of a 15-bit decimal word value $W_F$ from the phase detector 300, and the like.

The lock detector 500 receives output bits 8b, 8b, and 7b from the DLF 420 and generates lock indication signals LDc, LDm, and LDf for determining a locked state in the coarse locking mode, an intermediate locking mode, and a fine locking mode of the PLL.

The DCO 600 may include a multiplexer (MUX) 610 selectively outputting one of an 8-bit coarse adjustment value LFc or controlling the coarse adjustment bank and an 8-bit intermediate adjustment value LFm for controlling the intermediate adjustment bank provided from the DLF 420 according to the lock indication signals LDc and LDm from the lock detector 500, a dynamic element matching and thermometer code block (D&T) 620 for dynamically matching a fine adjustment capacitance value while converting a 7-bit fine adjustment value LFf for switching the fine adjustment bank of the DCO 600 provided from the DLF 420 into a thermometer code value, a DCO core 630 adjusting oscillation frequency through one of the coarse adjustment bank, the intermediate adjustment bank, and the fine adjustment bank according to an output value from the MUX 610 or the D&T 620, a 2-divider (DIV-2) 640 dividing an output frequency of the DCO core 630 by 2 to generate a DCO clock CKV, and a 4-divider (DIV-4) 650 dividing an output frequency of the DIV-2 640 by 4 and providing the resultant frequency to the SDM 430, and the like.

The operations of the digital loop filter 400, the lock detector 500, and the DCO will now be described.

The lock detector 500 receives the output bits 8 bits, 8 bits, and 7 bits from the DLF 420 of the digital loop filter 400, and generates the lock indication signals (LDc, LDm, LDf) for determining a locked state in the coarse locking mode, the intermediate locking mode, and the fine locking mode of the PLL.

The coarse locking signal LDc is a signal, generated upon receiving the 8-bit coarse adjustment value LFc from the DLF 420, indicating whether or not the PLL has been locked in the coarse locking mode of the PLL. It indicates that the coarse PLL is locked when the coarse locking signal LDc transitions from a low state to a high state. The MUX 610 then freezes the respective bits of the coarse adjustment value LFc of the DLF 420 according to the coarse locking signal LDc, and the DCO core 630 controls a capacitance value of the coarse adjustment bank according to the coarse adjustment value LFc of the DLF 420 to adjust the frequency of the DCO clock CKV.

The intermediate locking signal LDm is a signal, generated upon receiving the 8-bit intermediate adjustment value LFm from the DLF 420, indicating whether or not the PLL has been locked in the intermediate locking mode of the PLL. It indicates that the coarse PLL is locked when the intermediate locking signal LDm transitions from a low state to a high state. The MUX 610 then freezes the respective bits of the intermediate adjustment value LFm of the DLF 420 according to the intermediate locking signal LDm, and the DCO core 630 controls a capacitance value of the intermediate adjustment bank according to the intermediate adjustment value LFm of the DLF 420 to adjust the frequency of the DCO clock CKV.

The fine locking signal LDf is a signal, generated upon receiving the 7-bit fine adjustment value LFf from the DLF 420, indicating whether or not the PLL has been locked in the fine locking mode of the PLL. It indicates that the fine PLL is locked when the fine locking signal LDf transitions from a low state to a high state. The fine locking signal LDf is input to the DLF 420 to change the gain of the DLF 420, thus allowing a finer phase error of the phase detector 30 to be tracked through the PLL.

The D&T 620 receives the 7-bit fine adjustment value LFf from the DLF 420 and converts the received value into a thermometer code, and the DCO core 630 switches each capacitor of the fine adjustment bank on or off according to the converted thermometer code to minutely adjust the frequency of the DCO clock CKV.

Meanwhile, the SDM 430 receives upper 8-bit decimal word value of a 15-bit decimal word value of the DLF 420 and generates a 3-bit output, and the DCO core 630 switches three fine capacitors of the fine adjustment bank on or off to minutely shake the capacitance of the fine adjustment bank to thereby increase resolution of the output frequency of the DCO core 630.

Figure 8:
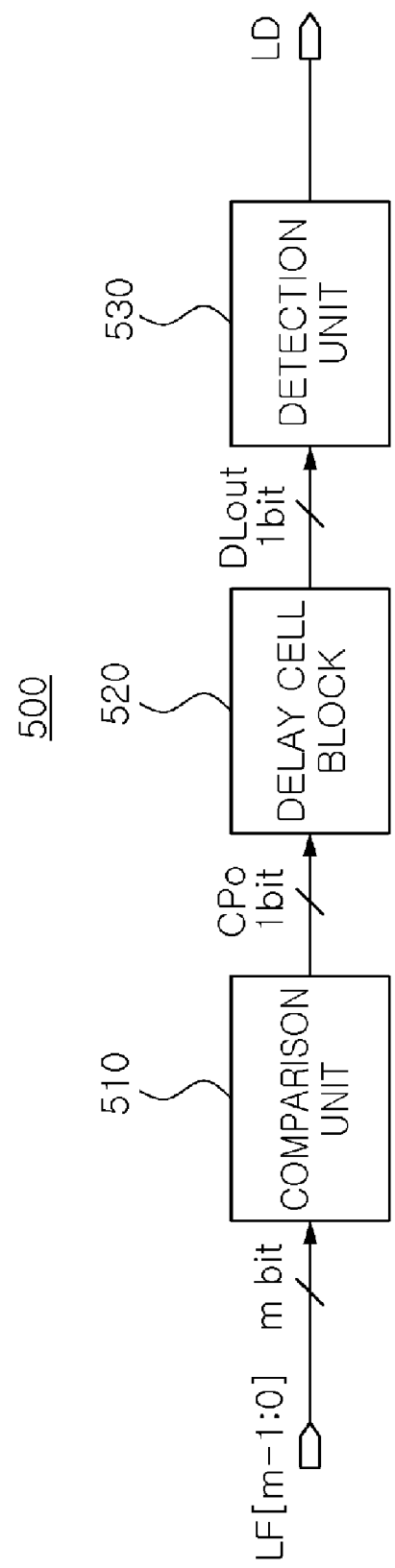
FIG. 8 is a detailed block diagram of the lock detector according to an exemplary embodiment of the present invention.

FIG. 8 is a detailed block diagram of the lock detector 500 according to an exemplary embodiment of the present invention.

With reference to FIG. 8, the lock detector 500 may include a comparison unit 510 comparing the bit values of a loop filter signal (LF[m−1:0]) provided from the digital loop filter 400 and outputting an 1-bit signal CPo indicating a time at which each bit of the loop filter signal (LF[m−1:0]) is fixed and a time at which every bit of the loop filter signal (LF[m−1:0]) is fixed, a delay cell block 520 generating a plurality of delay signals, each having a different phase, from the output signal CPo from the comparison unit 510 and XORing the plurality of delay signals and the output signal CPo from the comparison unit 510 to output a clock signal DLout in the form of impulse, and a detection unit 530 detecting a point in time at which the signal value of the output signal DLout from the delay cell block 520 changes, and outputting a lock indication signal LD for changing the operation mode of the DCO 600 at the corresponding point in time, and the like. In this case, the lock detector 500 may receive the 8-bit coarse adjustment value LFc, the 8-bit intermediate adjustment value LFm, and the 7-bit fine adjustment value LFf from the digital loop filter 400, and generate the coarse locking signal LDc, the 8-bit intermediate locking signal LDm, and the 7-bit fine locking signal LDf.

Figure 9:
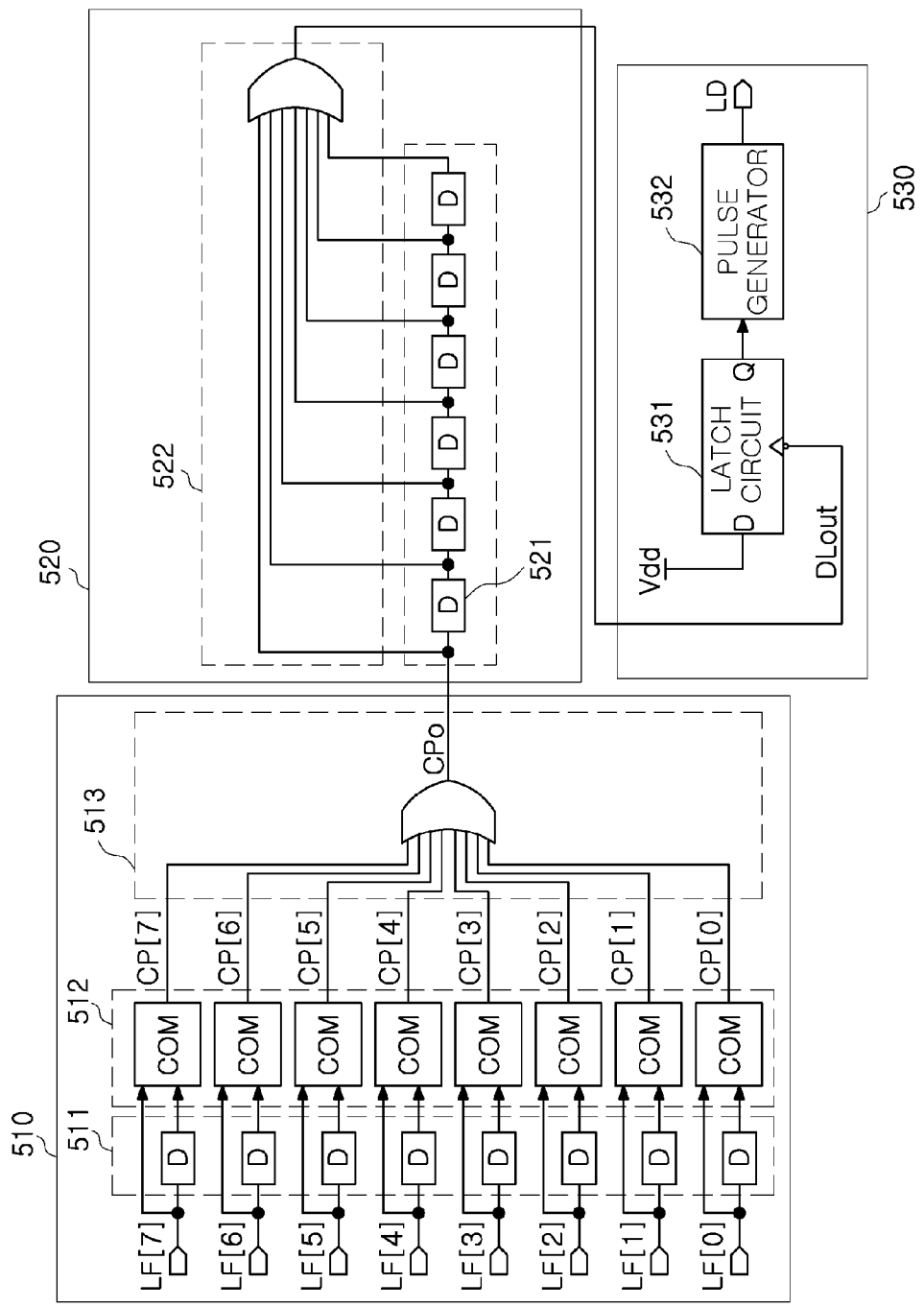
FIG. 9 is a detailed block diagram showing a comparison unit, a delay cell block, and a detection unit according to an exemplary embodiment of the present invention.

FIG. 9 is a detailed block diagram showing the comparison unit, the delay cell block, and the detection unit according to an exemplary embodiment of the present invention.

With reference to FIG. 9, the comparison unit 510 may include a plurality of delays 511 phase-delaying the respective bits of the loop filter signal (LF[m−1:0]) by one period of the retimed clock (CKRp or CKRn), a plurality of comparators 512 XORing the loop filter signal (LF[m−1:0]) and output signals from the plurality of delays 512 by bits, and an operator 513 ORing the output signals from the plurality of comparators 512 to output an 1-bit signal CPo, and the like.

The delay cell block 520 may include a delay chain 521 delaying the output from the comparison unit 510 by one period of the retimed clock (CKRp or CKRn) at each time, and an operator 522 ORing the output CPo from the comparison unit 510 and an output from the delay chain 521 to output a clock signal DLout in the form of impulse, and the like.

The detection unit 530 may include a latch circuit 531 detecting a point in time at which the signal value of the output signal DLout from the delay cell block 520 changes, and a pulse generator 532 outputting the lock indication signal LD in response to the output of the latch circuit 531, and the like.

Figure 10A:
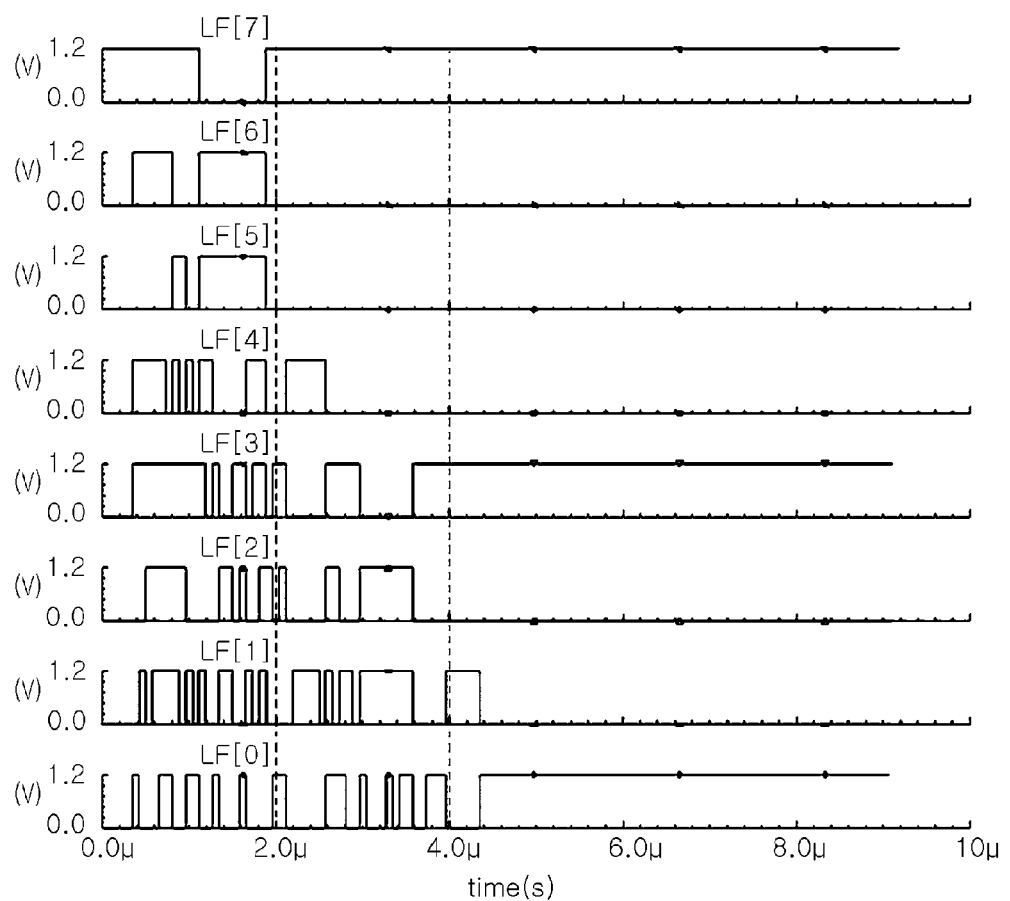
FIGS. 10a to 10e are views for explaining the operation of the lock detector according to an exemplary embodiment of the present invention.

The operation of the lock detector according to an exemplary embodiment of the present invention will now be described with reference to FIGS. 10a to 10e. In this case, it is assumed that the lock detector receives the loop filter signals (LF[0]~LF[7]) having such signal values as shown in FIG. 10a.

Figure 10B:
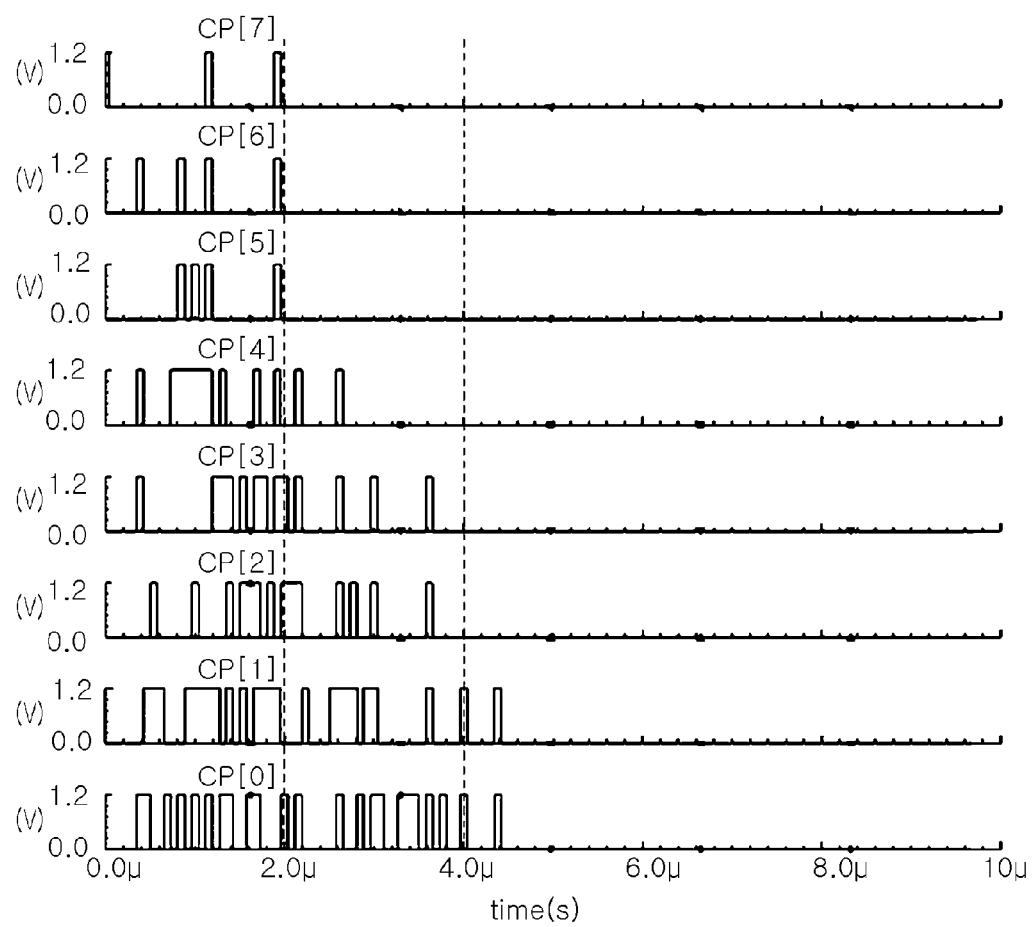
Figure 10C:
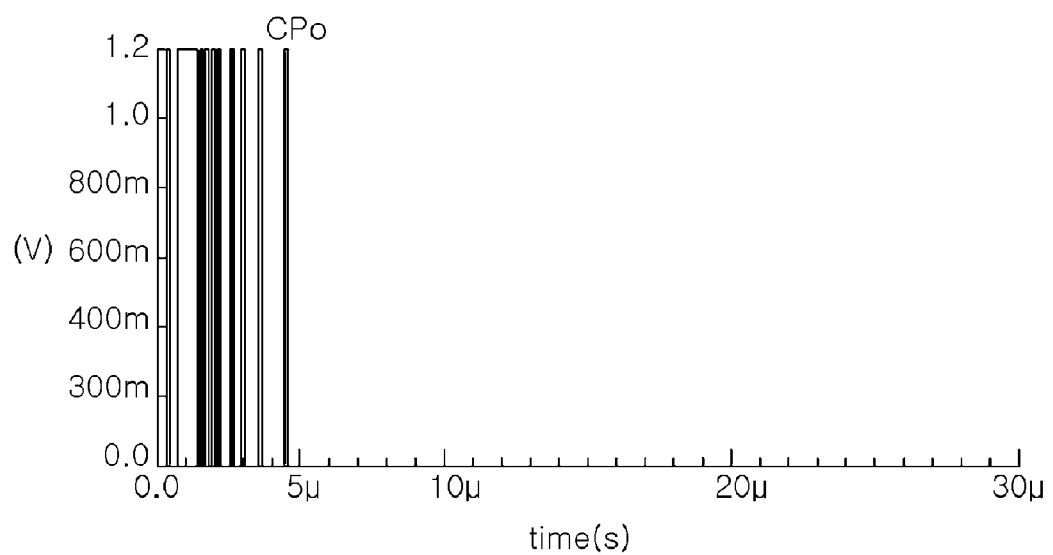

First, the comparison unit 510 delays each bit of the loop filter signals (LF[0]~LF[7]) by one period of the retimed clock (CKRp or CKRn) through the plurality of delays 511, XORs the results with the loop filter signal (LF[m−1:0]) by bits through the plurality of comparators 512 to generate signals (CP[0]~CP[7]) as shown in FIG. 10b, and performs ORing through the operator 513 to generate the signal CPo as shown in FIG. 10c.

When the ADPLL 100 is locked after the lapse of a certain time, the signal values from the loop filter signals (LF[0]~LF[7]) are uniformly maintained. Thus, while the signal values of the output signals from the plurality of delays 511 and the loop filter signals (LF[0]~LF[7]) keep changing, when a certain time has lapsed, they become uniformly maintained.

Thus, as shown in FIG. 10b, when a certain (e.g., 4.5μ sec) lapses, the output signals (CP[0]~CP[7]) from the plurality of comparators 512 are maintained at a low state. Also, when the certain time lapses, the output signal CPo of the operator 513 is maintained at a low state. Therefore, in an exemplary embodiment of the present invention, a time for the ADPLL 100 to be locked can be calculated by using the output signal CPo of the comparison unit 510.

Figure 10D:
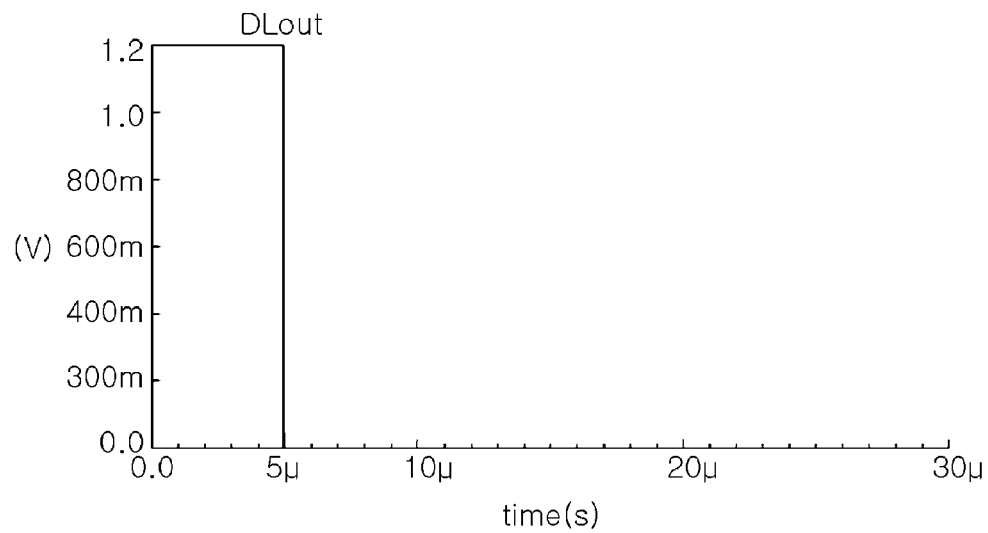

The delay cell block 520 gradually delays the phase of the output signal CPo from the comparison unit 510 through the delay chain 521, and then, ORs the output signal CPo from the comparison unit 510 and all the output signals from the delay chain 521 through the operator 522 to output the clock signal DLout which is maintained in a high state until before the ADPLL 100 is locked, and then transitions to a low state when the ADPLL 100 is locked, as shown in FIG. 10d.

Figure 10E:
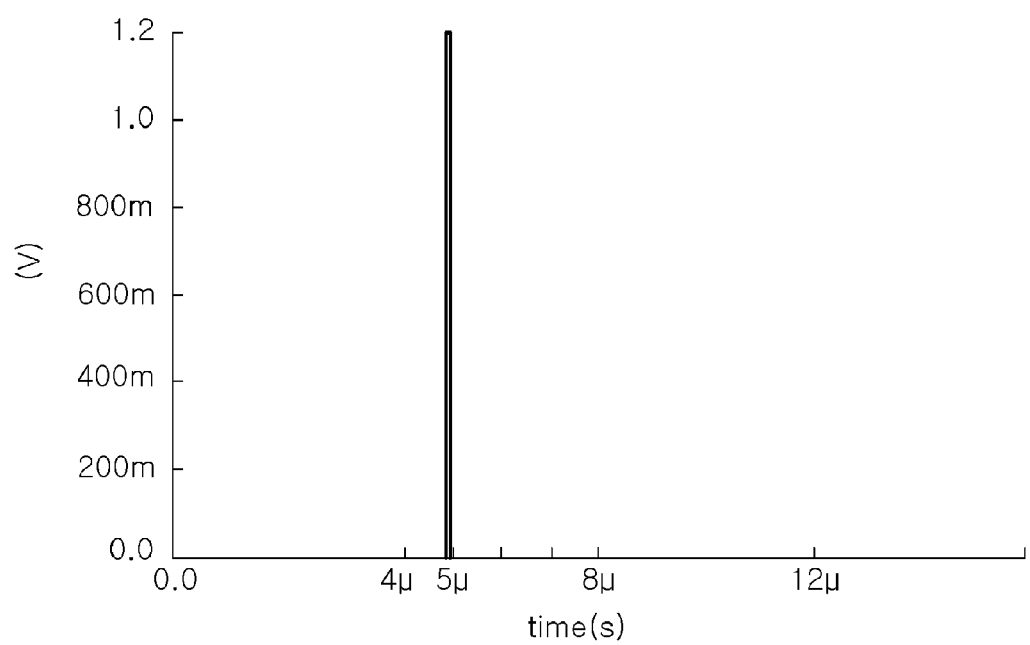

The latch circuit 531 is then synchronized with a falling edge of the clock signal DLout to generate a high level signal, and the pulse generator 532 generates the lock indication signal LD in response as shown in FIG. 10e.

Figure 11A:
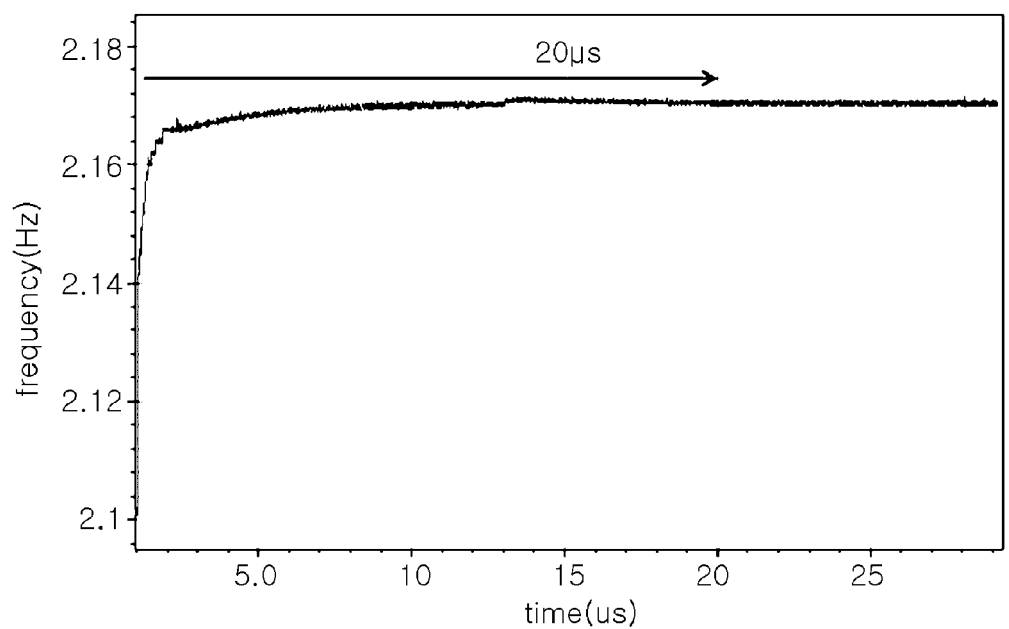
FIG. 11a is a graph showing frequency settlement characteristics of a digital PLL according to an exemplary embodiment of the present invention.
Figure 11B:
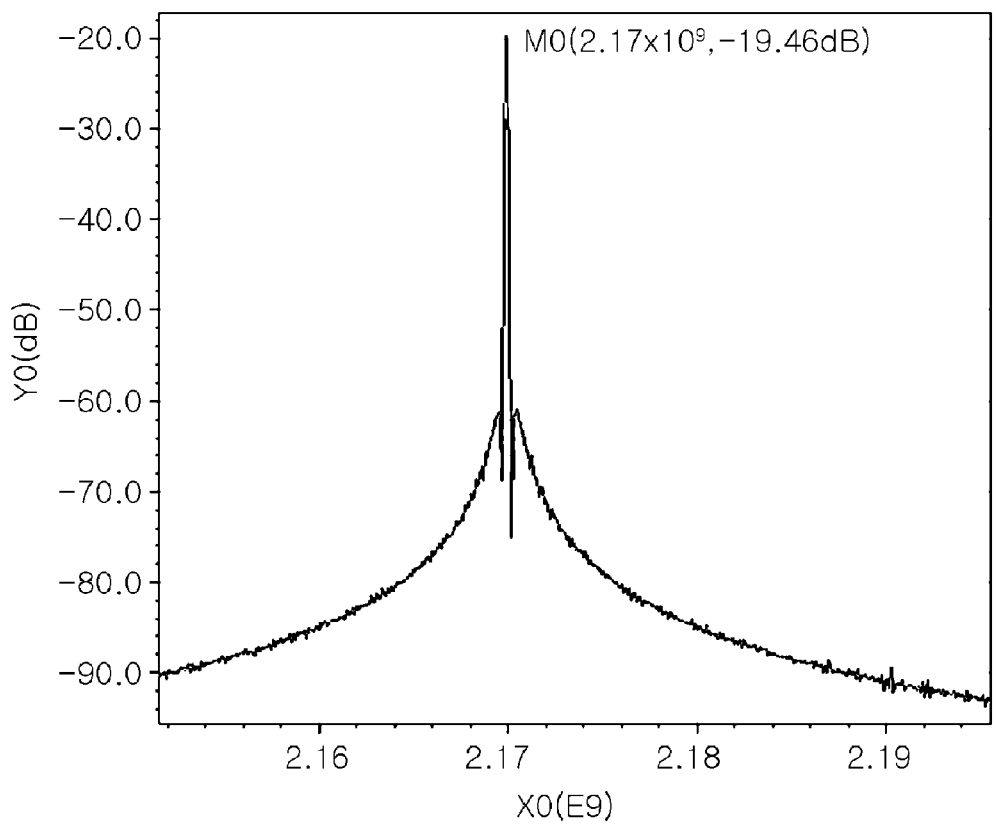
FIG. 11b is a graph showing an output spectrum of the digital PLL according to an exemplary embodiment of the present invention.

FIG. 11a is a graph showing frequency settlement characteristics of the digital PLL according to an exemplary embodiment of the present invention. It is noted that the output frequency of the digital PLL keeps changing over time, and when a certain time lapses, the output frequency of the digital PLL is fixed as a certain value, meaning that it is locked. FIG. 11b is a graph showing an output spectrum of the digital PLL according to an exemplary embodiment of the present invention, in which it is noted that the output frequency of the digital PLL is locked with a loop bandwidth at 2.17 GHz.

Figure 12:
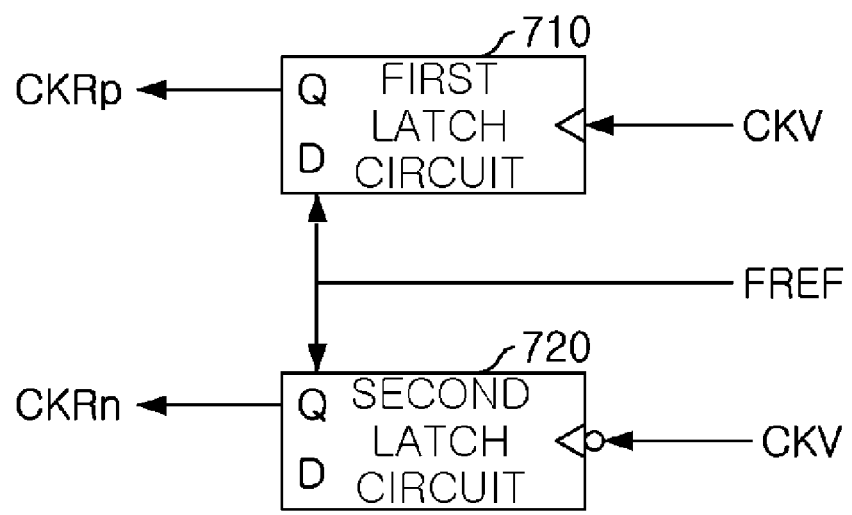
FIG. 12 is a detailed block diagram of a retimed clock generation unit according to an exemplary embodiment of the present invention.

FIG. 12 is a detailed block diagram of a retimed clock generation unit according to an exemplary embodiment of the present invention.

With reference to FIG. 12, the retimed clock generator 700 may include a first latch circuit 710 synchronized with a rising edge of the DCO clock CKV to acquire and output a signal value of the reference clock FREF, and a second latch circuit 720 synchronized with a falling edge of the clock CKV to acquire and output a signal value of the reference clock FREF.

Thus, the retimed clock generator 700 outputs the rising edge retimed clock CKRp, which has a lower frequency than that of the DCO clock CKV but is synchronized with the rising edge of the DCO clock CKV, through the first latch circuit 710, and outputs the falling edge retimed clock CKRn, which has a lower frequency than that of the DCO clock CKV but is synchronized with the falling edge of the DCO clock CKV, through the second latch circuit 720.

As set forth above, according to exemplary embodiments of the invention, the all digital phase-locked loop (ADPLL) includes a TDC which is able to reduce power consumption, noise, and the area while providing the same phase error detection capability as that of the related art, and detects a fine phase error required for compensating for a phase difference between a DCO clock and a reference clock by using the TDC. Thus, because the TDC has the 50% smaller power consumption, noise, and area than those of the related art, the ADPLL including the TDC has the reduced power consumption, noise, and area.

In addition, because a fixed point in time of a PLL is detected and a lock indication signal is generated through a simpler structure such as a delay circuit, a comparison circuit, and the like, instead of a look-up table which uses a memory and has a complicated structure, the power consumption, noise, and the area of the ADPLL can be further reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. An all digital phase-locked loop (ADPLL) comprising:
a phase counter configured to accumulate a phase of a frequency setting word and a phase of a digitally controlled oscillator (DCO) clock and detect a fine phase difference between a reference clock and a retimed clock;
a phase detector configured to compensate for a phase difference between the frequency setting word value and the DCO clock according to the fine phase difference between the reference clock and the retimed clock to detect a digital phase error value;
a digital loop filter configured to filter the digital phase error value and control PLL operational characteristics;
a lock detector configured to detect a point in time at which an output from the digital loop filter becomes uniform to generate a lock indication signal;
a digitally controlled oscillator configured to change a frequency of the DCO clock according to an output from the digital loop filter while changing an operation mode according to the lock indication signal; and
a retimed clock generator configured to generate the retimed clock by retiming the DCO clock at a low frequency.

2. The ADPLL of claim 1, wherein the retimed clock generator comprises:
a first latch circuit configured to be synchronized with a rising edge of the DCO clock to acquire and output a signal value of the reference clock to generate a rising edge retimed clock; and
a second latch circuit configured to be synchronized with a falling edge of the DCO clock to acquire and output a signal value of the reference clock to generate a falling edge retimed clock.

3. The ADPLL of claim 2, wherein the phase counter comprises:
a reference phase accumulator configured to accumulate the phase of the frequency setting word according to the rising edge retimed clock;
a variable phase accumulator configured to accumulate the phase of the DCO clock;
a sampler configured to sample a value of the variable phase accumulator according to the rising edge retimed clock to detect a variation of the DCO clock; and
a time-to-digital converter (TDC) configured to detect a phase difference between the reference clock and the rising edge retimed clock.

4. The ADPLL of claim 3, wherein the TDC comprises:
a delay chain configured to delay the phase of the reference clock;
a sampler configured to sample an output from the delay chain according to the rising edge retimed clock and the falling edge retimed clock;
an edge detector configured to detect a point in time at which an output value from the sampler changes to acquire a first fine phase difference between the reference clock and the rising edge retimed clock and a second fine phase difference between the reference clock and the falling edge retimed clock; and
a normalization multiplier configured to perform subtraction with respect to the first fine phase difference and the second fine phase difference, double a resultant value of the subtraction to calculate a DCO clock period, normalize the first fine phase difference in the interval of the DCO clock period, and output a normalized fine phase difference.

5. The ADPLL of claim 4, wherein the normalization multiplier comprises:
a subtractor configured to perform the subtraction with respect to the first fine phase difference and the second fine phase difference;
an absolute value acquirer configured to acquire an absolute value of an output from the subtractor;
a doubler configured to double an output from the absolute value acquirer to acquire the DCO clock period; and
a multiplier configured to multiply the first fine phase difference by a reciprocal number of the DCO clock period and output a resultant value of the multiplication.

6. The ADPLL of claim 5, wherein the normalization multiplier further comprises:
a DCO clock period averager configured to average the DCO clock period acquired by the doubler;
a multiplexer configured to selectively output one of the DCO clock period acquired by the doubler and the DCO clock period averaged by the averager; and
a memory configured to store the DCO clock period selected by the multiplexer.

7. The ADPLL of claim 3, wherein the TDC comprises:
a delay chain configured to delay the phase of the reference clock;
a sampler configured to sample an output from the delay chain according to the rising edge retimed clock;
an edge detector configured to detect a point in time at which the output value from the sampler changes to acquire a third fine phase difference between the reference clock and the rising edge retimed clock; and
a normalization multiplier configured to acquire a maximum value and a minimum value of the third fine phase difference, perform subtraction with respect to the maximum value and the minimum value to calculate the DCO clock period, normalize the third fine phase difference in the interval of the DCO period, and output a resultant value of the normalization.

8. The ADPLL of claim 7, wherein the normalization multiplier comprises:
a maximum value and minimum value detector configured to detect the maximum value and the minimum value of the third fine phase difference;

a subtractor configured to perform subtraction with respect to the maximum value and the minimum value to acquire the DCO clock period; and a multiplier configured to multiply the third fine phase difference by a reciprocal number of the DCO clock and output a resultant value of the multiplication.

9. The ADPLL of claim 8, wherein the normalization multiplier further comprises:

a multiplexer configured to selectively output one of the DCO clock period acquired by the subtractor and a preset DCO clock period; and a memory configured to provide an output from the multiplexer to the multiplier.

10. The ADPLL of claim 1, wherein the lock detector comprises:

a comparison unit configured to compare the output from the digital loop filter by bits;

a delay cell block configured to generate a plurality of delay signals each having a different phase from an output from the comparison unit and perform a logical OR operation on the plurality of delay signals and the output from the comparison unit; and a detection unit configured to detect a point in time at which an output value from the delay cell block changes and output the lock indication signal.

11. The ADPLL of claim 10, wherein the comparison unit comprises:

a plurality of delays configured to delay the phase of the output from the digital loop filter by bits;

a plurality of comparators configured to compare the output from the digital loop filter and outputs from the plurality of delays; and an operator configured to perform a logical OR operation on the outputs from the plurality of comparators.

12. The ADPLL of claim 11, wherein the delay cell block comprises:

a delay chain configured to delay the phase of the output from the comparison unit; and an operator configured to perform a logical OR operation on the output from the delay chain and the output from the comparison unit.

13. The ADPLL of claim 10, wherein the detection unit comprises:

a latch circuit configured to detect a point in time at which the output value from the delay cell block changes; and a pulse generator configured to output a lock indication signal in response to an output from the latch circuit.

14. The ADPLL of claim 1, wherein the digitally controlled oscillator is configured to select one of a coarse adjustment bank, an intermediate adjustment bank, and a fine adjustment bank according to the lock indication signal and change a capacitance value of the selected adjustment bank according to the output from the digital loop filter to control the frequency of the DCO clock.

15. A time-to-digital converter (TDC) comprising:

a delay chain configured to delay the phase of a reference clock and output a delayed reference clock;

a sampler receiving a rising edge retimed clock and a falling edge retimed clock and configured to sample the delayed reference clock according to the rising edge retimed clock and the falling edge retimed clock, the rising edge retimed clock and the falling edge retimed clock being obtained by synchronizing the reference clock to a rising edge and a falling edge of a digitally controlled oscillator (DCO) clock, respectively;

an edge detector configured to detect a point in time at which an output value from the sampler changes to acquire a first fine phase difference between the reference clock and the rising edge retimed clock and a second fine phase difference between the reference clock and the falling edge retimed clock; and a normalization multiplier configured to perform subtraction with respect to the first fine phase difference and the second fine phase difference, double a resultant value of the subtraction to calculate a DCO clock period, normalize the first fine phase difference in the interval of the DCO clock period, and output the normalized fine phase difference.

16. The TDC of claim 15, wherein the normalization multiplier comprises:

a subtractor configured to perform the subtraction with respect to the first fine phase difference and the second fine phase difference;

an absolute value acquirer configured to acquire an absolute value of an output from the subtractor;

a doubler configured to double an output from the absolute value acquirer to acquire the DCO clock period; and a multiplier configured to multiply the first fine phase difference by a reciprocal number of the DCO clock period and output a resultant value of the multiplication.

17. A time-to-digital converter (TDC) comprising:

a delay chain configured to delay the phase of a reference clock and output a delayed reference clock;

a sampler receiving a rising edge retimed clock obtained by synchronizing the reference clock to a rising edge of a digitally controlled oscillator (DCO) and configured to sample the delayed reference clock according to the rising edge retimed clock;

an edge detector configured to detect a point in time at which an output value from the sampler changes to acquire a fine phase difference between the reference clock and the rising edge retimed clock; and a normalization multiplier configured to acquire a maximum value and a minimum value of the fine phase difference, perform subtraction with respect to the maximum value and the minimum value to calculate a DCO clock period, normalize the fine phase difference in the interval of the DCO clock period, and output the normalized fine phase difference.

18. The TDC of claim 17, wherein the normalization multiplier comprises:

a maximum and minimum value detector configured to detect the maximum value and the minimum value of the fine phase difference;

a subtractor configured to perform the subtraction with respect to the maximum value and the minimum value to acquire the DCO clock period; and a multiplier configured to multiply the fine phase difference by a reciprocal number of the DCO clock and output a resultant value of the multiplication.

* * * * *